(12) United States Patent  
Watarai

(10) Patent No.: US 6,492,851 B2
(45) Date of Patent: Dec. 10, 2002

(54) DIGITAL PHASE CONTROL CIRCUIT

(75) Inventor: Seiichi Watarai, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/819,599

(22) Filed: Mar. 29, 2001

(65) Prior Publication Data

US 2001/0035784 A1 Nov. 1, 2001

(30) Foreign Application Priority Data

Mar. 30, 2000 (JP) ........................................ 2000-095604

(51) Int. Cl.$^7$ ................................................ H03L 7/06
(52) U.S. Cl. ...................... 327/158; 327/161; 327/237; 327/231; 327/261
(58) Field of Search ................................ 327/231, 156, 327/158, 161, 271, 148, 237, 261

(56) References Cited

U.S. PATENT DOCUMENTS 6,100,735 A * 8/2000 Lu ............................. 327/158

FOREIGN PATENT DOCUMENTS

| JP | 9-18304 | 1/1997 |
| JP | 9-18305 | 1/1997 |

* cited by examiner

*Primary Examiner*—Dinh T. Le
(74) *Attorney, Agent, or Firm*—McGinn & Gibb, PLLC

(57) ABSTRACT

The digital phase control circuit of the present invention is provided with: voltage-controlled delay line VCDL1 in which differential buffers (G1–G10) having a propagation delay time of 160 ps are concatenated in a plurality of stages; voltage-controlled delay line (VCDL2) in which differential buffers (H1–H8) having a propagation delay time of 200 ps are concatenated in a plurality of stages; selector (S2) that extracts a clock signal from any stage of voltage-controlled delay line (VCDL1) and outputs to the first stage of voltage-controlled delay line (VCDL2); and selector S3 that extracts and outputs a clock signal from any stage of voltage-controlled delay line (VCDL2). This digital phase control circuit (10) feedback-controls voltage-controlled delay line (VCDL1) and voltage-controlled delay line (VCDL2) by delay locked loops (DLL1) and (DLL2), controls the phases of clock signals with the difference 40 ps between 160 ps and 200 ps as the resolution; and therefore is a power-saving, compact, and high-resolution digital phase control circuit that suppresses increase in power consumption and increase in the area occupied by circuits to a minimum.

5 Claims, 4 Drawing Sheets

DIGITAL PHASE CONTROL CIRCUIT

BACKGROUND OF THE INVENTION

1. Field of the Invention:

The present invention relates to a digital phase control circuit that receives reference clock signals having a prescribed frequency and outputs one or more clock signals in which phase is controlled in units of a prescribed delay difference (resolution) with respect to the reference clock signal.

2. Description of the Related Art:

A digital phase control circuit that receives reference clock signals having a prescribed frequency and that outputs one or more clock signals in which phase is controlled in units of a prescribed delay difference (resolution) with respect to the reference clock signal is configured similar to an example of the prior art, digital phase control circuit 100, that is shown in FIG. 1.

This digital phase control circuit 100 of the prior art is configured such that: input selector S1 having four input terminals is connected to delay locked loop DLL 1 that includes a voltage-controlled delay line VCDL 1 that is composed of ten stages of differential buffers G1–G10 and the differential buffer is a kind of delay buffer; and moreover, output selector S2 is connected to the output of each of differential buffers G1–G10. Delay locked loop DDL1 is composed of: voltage-controlled delay line VCDL1; phase detector PD1; charge pump CP1; and low-pass filter LPF1.

The composition and operation of this prior-art digital phase control circuit is next explained using numerical values.

Clock signals CLK1-4 (reference clocks) of 325.5 MHz (with a period of 3200 ps) in a total of four phases with phase differences of 800 ps are supplied to the four input terminals IN of selector S1. In other words, two clock signals CLK1 and CLK3 having a half-period phase difference (1600 ps) with respect to each other form one differential pair, and similarly, another two clock signals CLK2 and CLK4 having a relative half-period phase difference (1600 ps) form a differential pair.

These clock signals CLK1–CLK4 are controlled in advance by, for example, a phase-locked loop that is not shown in the figure such that the frequencies of the four clock signals CLK1–CLK4 and the phase differences between them (800 ps) are equal and are then supplied to input terminals IN.

Selector S1 selects and extracts a differential pair from the plurality of input terminals IN. In other words, selector S1 selects a pair of differential clock signals from the four types of differential clock signals CLK1-3, CLK3-1, CLK2-4, and CLK4-2, and outputs to voltage-controlled delay line VCDL1 and phase detector PD1.

In a case in which differential clock signals CLK1-3 are selected, clock signal CLK1 is outputted to one of the two output terminals OUT, and clock signal CLK3 is outputted to the other.

The operation is equivalent in cases in which differential clock signals CLK3-1, CLK2-4, or CLK4-2 are selected. However, the output terminals OUT to which differential clock signals CLK1 and CLK3 are outputted when differential clock signals CLK1-3 are selected is the reverse of that for a case in which differential clock signals CLK3-1 are selected. The same relation holds for differential clock signals CLK2-4 and differential clock signals CLK4-2.

The ten stages of differential buffers G1–G10 that make up voltage-controlled delay line VCDL1 each have propagation delay times of 160 ps and are controlled by the feedback control of delay locked loop DLL1 such that their delay times are uniform. The feedback control of delay locked loop DLL1 is carried out as follows:

A clock signal having the total delay of all buffers G1–G10 is outputted from differential buffer G10. In a case in which differential clock signals CLK1-3 are selected by selector S1, for example, phase detector PD1 both receives clock signals CLK1 and CLK3 that have passed through voltage-controlled delay line VCDL1 and have the total delay of all buffers G1–G10 and receives direct clock signals CLK1 and CLK3 (reference clocks) that have not passed through voltage-controlled delay line VCDL1. Phase detector PD1 compares the phases of clock signal CLK1, which has the total delay, and clock signal CLK3 (the reference clock) that precedes passage through voltage-controlled delay line VCDL1, compares the phases of clock signal CLK3 having the total delay and clock signal CLK1 (the reference clock) that precedes passage through voltage-controlled delay line VCDL1, and detects the phase differences. Phase detector PD1 outputs an UP signal to charge pump CP1 if the phase of clock signal CLK1 (CLK3) having the total delay is behind the phase of clock signal CLK3 (CLK1) that precedes passage though voltage-controlled delay line VCDL1; and outputs a DOWN signal to charge pump CP1 if the phase of clock signal CLK1 (CLK3) is ahead. The operation is equivalent for cases in which differential clock signals CLK3-1, CLK2-4 or CLK4-2 are selected by selector S1.

Charge pump CP1 and low-pass filter LPF1 generate control signals such that each buffer maintains a propagation delay time of 160 ps in accordance with the signals from phase detector PD1 and sends these control signals to each of differential buffers G1–G10.

By means of this feedback control, the delay times of the ten stages of buffers in voltage-controlled delay line VCDL1 are kept uniform. In other words, the period of 160 ps×10 stages=1600 ps is constantly corrected in voltage-controlled delay line VCDL1.

Clock signals having a resolution of 160 ps with respect to the reference clocks are outputted from output terminals OUT through the combination of selections of selectors S1 and S2.

Taking for example a case in which differential buffer G5 is selected by selector S2 as the base state, the output delay of delay locked loop DLL1 at this time will be the delay time 160 ps×5 stages 800 ps, if the delay of selectors S1 and S2 is ignored.

In contrast to this base state, the delay becomes 160 ps×6 stages=960 ps if differential buffer G6 is selected by selector S2. In other words, delay (phase) is delayed with respect to the total delay of the basic state at a resolution of 160 ps.

Still further delay of the phase of the clock signal can be realized by selecting, by means of selector S2, a differential buffer having a higher number in delay locked loop DLL1. Conversely, an advance in the phase of the clock signal can be realized by selecting, by means of selector S2, a buffer having a lower number in delay locked loop DLL1. Thus, in digital phase control circuit 100 of the prior-art example, the delay (phase) resolution coincides with the propagation delay time (160 ps) of the buffers in voltage-controlled delay line VCDL1, i.e., resolution is determined by the buffer propagation delay time.

However, the prior art has the following problems:

Since resolution is determined by the propagation delay time of the buffers, the propagation delay time of the differential buffers must be decreased (made high-speed) to obtain a more minute resolution. However, there are limits to the buffer delay time, and currently, constructing buffers having a delay time of less than 50 ps is technologically extremely difficult. There is consequently the problem that a resolution smaller than the propagation delay time of a buffer cannot be obtained. Since the amount of phase control that is necessary for clock recovery for high-speed data of 2.5 Gbps is on the order of 40–50 ps, the realization of a digital phase control circuit that is capable of controlling phase at a resolution of less than 50 ps is crucial for realizing the high-speed data communication that is now being sought.

In addition, since feedback control is effected by delay locked loop DLL1 such that the total delay of all buffers in voltage-controlled delay line VCDL1 matches the delay (1600 ps) of half-period portions of the received reference clocks, the number of inserted buffers must be increased to the extent that resolution is decreased. If the resolution is reduced to ¼, for example, the number of buffers must be increased fourfold. Accordingly, there is the problem of the increase in circuit current required to increase the buffer speed. There is also the problem that power consumption increases due to the additional circuit current needed for the additional buffers. There is the further problem that the area occupied by circuits increases due to the number of additional buffers.

Delay circuits have been disclosed in Japanese Patent Laid-open No. 18304/97 and Japanese Patent Laid-open No. 18305/97 for freely setting resolution and correcting for variations that arise from fabrication and temperature. These inventions involve delay circuits of a path switching type in which delay times are switched by selecting one of a plurality of paths having different delay times. These delay circuits enable the free setting of resolution, which is produced by the time difference between the delay time of a variable delay gate that is controlled by a first delay time compensation unit and the delay time of a variable delay gate that is controlled by a second delay time compensation unit. In addition, variations in resolution are equalized because the delay time generation circuit and paths are arranged in proximity to each other.

In these delay circuits of the path-switching type, however, there is the problem that the number of selectors and the number of buffers in each stage must be increased to raise resolution. The problems of increase in power consumption and increase in the area occupied by circuits caused by increase in the number of buffers cannot be solved in these path-switching delay circuits.

The increase in the number of selectors in particular creates a problem because the harmful effects caused by deviations in switch timing when switching selectors must be prevented.

In these path-switching delay circuits, moreover, although first and second delay time compensation units for controlling delay times are feedback-controlled by a delay locked loop to correct resolution, the delay processing unit (delay time generation circuit) that actually delays clock signals is not feedback-controlled by a delay locked loop and merely receives delay control signals from the first and second delay time compensation units. Thus, when the delay time compensation unit is separated from the delay processing unit and the feedback system for propagating delay control signals is lengthened, there is the problem that variations in resolution (delay time) are produced by the positions of buffers due to the voltage drop of the control signals.

Finally, in these path-switching delay circuits, both the selectors and the clock frequencies for phase comparison must also be changed in order to change resolution. In concrete terms, the frequency of the reference clocks is changed by a PLL in Japanese Patent Laid-open No. 18304/97 and by a synthesizer in Japanese Patent Laid-open No. 18305/97. In other words, these path-switching delay circuits are analog circuits, and clocks of two different frequencies are generated within the same circuit. As a result, not only is there a danger of generating detrimental resonance, but there is the problem that the circuits cannot be applied to devices having a fixed frequency.

SUMMARY OF THE INVENTION

The present invention was achieved in view of the above-described problems in the prior art, and has as an object the provision of a power-saving, compact, high-resolution digital phase control circuit that outputs one or more clock signals in which phase is controlled at a prescribed resolution with respect to received reference clock signals of a prescribed frequency that can obtain a resolution that is more minute than the propagation delay time of buffers and that suppresses to a minimum both increase in power consumption and increase in the area occupied by circuits.

It is another object of the present invention to provide a digital phase control circuit that is capable of suppressing the number of selectors to a minimum and thus reduce the harmful effects resulting from variations in switch timing of a plurality of selectors.

It is yet another object of the present invention to provide a digital phase control circuit that can operate with high reliability below a fixed frequency and continuously control clock signals at a resolution (delay time) that is accurate and free of variations.

The first invention of this application that solves the above-described problems is a digital phase control circuit that outputs one or more clock signals in which phase is controlled at a prescribed resolution with respect to a received reference clock signal of a prescribed frequency, that is provided with:

prescribed numbers of each of two or more types of delay buffers, each type having a different propagation delay time; wherein, by varying the number of each type of delay buffer through which said clock signals are caused to pass, the total delay time of said clock signals is changed in units that are more minute than the propagation delay times of said delay buffers to control the phase of said clock signals.

In this case, the difference in the types of delay buffers refers to the difference in the propagation delay times of the delay buffers.

The number of each type of delay buffer though which clock signals are caused to pass is assumed to include "0."

Thus, the digital phase control circuit of the first invention of this application is provided with prescribed numbers of two or more types of delay buffers, each type having a different propagation delay time, wherein, by varying the number of each type of delay buffer through which said clock signals are caused to pass, the total delay time of said clock signals is changed in units that are more minute than the propagation delay times of said delay buffers to control the phase of said clock signals; and the digital phase control circuit of the first invention therefore has the advantage of making the resolution smaller than the delay time of the delay buffers. The invention therefore has the advantage of allowing a resolution to be obtained that is even more minute than the minute delay time that is the limit of the delay buffers.

Furthermore, there is no need to decrease the delay time (increase the speed) of the delay buffers in order to obtain a smaller resolution, whereby the drawback can be eliminated that the number of delay buffers must be increased in order to obtain smaller resolution.

As a result, the increase in power consumption that accompanies higher speed of the delay buffers and the increase in power consumption that accompanies increase in the number of delay buffers are both avoided, and moreover, the increase in area occupied by circuits, which accompanies increase in the number of delay buffers, can also be avoided. The invention therefore has the merit of enabling a power-saving, compact, high-resolution digital phase control circuit.

Since there is no need to decrease the delay time of the delay buffers (increase speed) in order to obtain a smaller resolution, there is no need for high-level design or high-performance processing to obtain higher speed. As a result, a high-resolution digital phase control circuit can be constructed without increasing the design load or processing load.

Additional advantages include enabling operation below a fixed frequency with high reliability and continuous control of clock signals at a resolution (delay time) that is accurate and free of discrepancies.

The second invention of this application is the digital phase control circuit of the first invention of this application provided with:

a first voltage-controlled delay line that is composed of delay buffers having a first type of propagation delay time concatenated in a plurality of stages and that receives reference clock signals;

a second voltage-controlled delay line that is composed of delay buffers having a second type of propagation delay time concatenated in a plurality of stages;

a first selector that extracts a clock signal from any stage of the first voltage-controlled delay line and outputs this extracted clock signal to the first stage of the second voltage-controlled delay line; and a second selector that extracts and outputs a clock signal from any stage of the second voltage-controlled delay line.

The third invention of this application is a digital phase control circuit that outputs one or more clock signals in which phase is controlled at a prescribed resolution with respect to received reference clock signals of a prescribed frequency, and that is provided with:

a first voltage-controlled delay line that is composed of delay buffers having a first type of propagation delay time concatenated in a plurality of stages and that receives reference clock signals;

a second voltage-controlled delay line that is composed of delay buffers having a second type of propagation delay time concatenated in a plurality of stages;

a first selector that extracts a clock signal from any stage of the first voltage-controlled delay line and outputs this extracted clock signal to the first stage of the second voltage-controlled delay line; and a second selector that extracts and outputs a clock signal from any stage of the second voltage-controlled delay line;

wherein the first voltage-controlled delay line and the second voltage-controlled delay line are each feedback-controlled by a respective delay locked loop;

the time difference between the first type of propagation delay time and the second type of propagation delay time is set smaller than both the first type of propagation delay time and the second type of propagation delay time; and the phases of clock signals are controlled with the time difference between the first type of propagation delay time and the second type of propagation delay time as the resolution.

The digital phase control circuit of the third invention of this application therefore has the merit that resolution is smaller than the delay time of the delay buffers because the time difference between the first type of propagation delay time and the second type of propagation delay time is set smaller than both the first type of propagation delay time and the second type of propagation delay time, and the phases of clock signals are controlled with the time difference between the first type of propagation delay time and the second type of propagation delay time as the resolution. The invention therefore has the merit that a resolution can be obtained that is even smaller than the minute delay time that is the limit of the delay buffers.

In addition, eliminating the need to decrease the delay time of the delay buffers in order to obtain smaller resolution eliminates the drawback that the number of delay buffers must be increased in order to obtain smaller resolution.

The invention therefore has the merits of avoiding the increase in power consumption that accompanies higher speed of delay buffers, the increase in power consumption that accompanies increase in the number of delay buffers, and further, the increase in area occupied by circuits that accompanies increase in the number of delay buffers, thereby enabling a power-saving, compact, high-resolution digital phase control circuit.

Furthermore, since there is no need to decrease the delay time (increase the speed) of the delay buffers in order to obtain a smaller resolution, there is no need for high-level design or high-performance processing for higher speed. The invention therefore has the merit of enabling the construction of a high-resolution digital phase control circuit without increasing the design load or processing load.

The invention further has the merit of suppressing the number of selectors to a minimum, thereby reducing the harmful effects caused by discrepancies in the switch timing of a plurality of selectors.

The invention is also advantageous because it enables operation below a fixed frequency with high reliability and continuous control of clock signals at a resolution (delay time) that is accurate and free of discrepancies.

The fourth invention of the present application is the digital phase control circuit of the first invention of this application that is provided with:

a first voltage-controlled delay line that is composed of delay buffers having a first type of propagation delay time concatenated in h stages and that receives reference clock signals;

i second voltage-controlled delay lines that are each connected to an output of i stages of outputs of the first voltage-controlled delay line and that are each composed of delay buffers having a second type of propagation delay time concatenated in j stages;

a third voltage-controlled delay line that is composed of delay buffers having the second type of propagation delay time concatenated in k stages; and a selector that extracts a clock signal from any stage of the first voltage-controlled delay line and second voltage-controlled delay lines and outputs this extracted clock signal to the first stage of the third voltage-controlled delay line.

The fifth invention of the present application is a digital phase control circuit that outputs one or more clock signals in which phase is controlled at a prescribed resolution with respect to received reference clock signals of a prescribed frequency, and is provided with:

a first voltage-controlled delay line that is composed of delay buffers having a first type of propagation delay time concatenated in h stages and that receives reference clock signals;

i second voltage-controlled delay lines that are each connected to an output of the i stages of outputs of the first voltage-controlled delay line and that are composed of delay buffers having a second type of propagation delay time concatenated in j stages;

a third voltage-controlled delay line that is composed of delay buffers having the second type of propagation delay time concatenated in k stages; and a selector that extracts a clock signal from any stage of the first voltage-controlled delay line and the second voltage-controlled delay line and outputs this extracted clock signal to the first stage of the third voltage-controlled delay line;

wherein the first voltage-controlled delay line and the third voltage-controlled delay line are each feedback-controlled by a respective delay locked loop, and a delay control voltage or current for maintaining the resolution that is generated by the delay locked loop that feedback-controls the third voltage-controlled delay line is supplied to each of the delay buffers of each second voltage-controlled delay line;

the time difference between the first type of propagation delay time and the second type of propagation delay time is set smaller than both the first type of propagation delay time and the second type of propagation delay time; and the phases of clock signals are controlled with the time difference between the first type of propagation delay time and the second type of propagation delay time as the resolution. Here, h, i, j, and k are natural numbers wherein h and i have the relation that h is equal to or larger than (i-1).

The digital phase control circuit of the fifth invention of this application has the merit that the resolution is smaller than the delay time of the delay buffers because the time difference between the first type of propagation delay time and the second type of propagation delay time is set smaller than both the first type of propagation delay time and the second type of propagation delay time, and the phases of clock signals are controlled with the time difference between the first type of propagation delay time and the second type of propagation delay time as the resolution. This invention therefore has the merit of enabling a resolution that is smaller than the minute delay time that is the limit of the delay buffers.

In addition, since there is no need to decrease the delay time (increase the speed) of the delay buffers in order to obtain smaller resolution, there is no drawback that the number of delay buffers must be increased in order to obtain smaller resolution.

The invention therefore has the merits of avoiding increase in power consumption that accompanies higher speed of the delay buffers, the increase in power consumption that accompanies increase in the number of delay buffers, and further, the increase in area occupied by circuits that accompanies increase in the number of delay buffers, thereby enabling a power-saving, compact, high-resolution digital phase control circuit.

Furthermore, since there is no need to decrease the delay time (increase the speed) of the delay buffers in order to obtain a smaller resolution, there is no need for high-level design or high-performance processing to obtain higher speed. The invention therefore has the merit of enabling the construction of a high-resolution digital phase control circuit without increasing the design load or processing load.

The invention further has the merit that only one selector is included, thereby eliminating the harmful effects of discrepancies in the switch timing of a plurality of selectors.

The invention is also advantageous because it enables operation below a fixed frequency with high reliability and continuous control of clock signals at a resolution (delay time) that is accurate and free of discrepancies.

In particular, the digital phase control circuit of the fifth invention of the present application has the merits of suppressing variations in the propagation delay times that arise from the positions of the delay buffers and improving the accuracy of resolution because the first voltage-controlled delay line and the third voltage-controlled delay line are each feedback-controlled by a respective delay locked loop, and a delay control voltage or current for maintaining the resolution that is generated by the delay locked loop that feedback-controls the third voltage-controlled delay line is supplied to each of the delay buffers of each of the second voltage-controlled delay lines.

The sixth invention of the present application is the digital phase control circuit of the fifth invention of the present application in which at least one voltage-controlled delay line of the second voltage-controlled delay lines is feedback-controlled by a delay locked loop, and a delay control voltage or current for maintaining resolution that is generated by the delay locked loop that feedback-controls the one voltage-controlled delay line is supplied to each delay buffer of the other second voltage-controlled delay lines to control the phase of clock signals.

Thus, in addition to the merits of the fifth invention of this application, the digital phase control circuit of the sixth invention of this application has the merits of maintaining the propagation delay time of the delay buffers that constitute the voltage-controlled delay lines to a fixed level, suppressing variations in the propagation delay time that are caused by the positions of the delay buffers, and further improving the resolution accuracy.

The seventh invention of the present application is the digital phase control circuit of the first invention of this application provided with:

a first voltage-controlled delay line that is composed of delay buffers having a first type of propagation delay time concatenated in a plurality of stages and that receives reference clock signals;

a second voltage-controlled delay line that is composed of delay buffers having a second type of propagation delay time concatenated in a plurality of stages;

a cyclic delay circuit that is connected to the input side of the second voltage-controlled delay line and that is composed of variable delay buffers, for which the propagation delay time can be switched between the first type of propagation delay time and the second type of propagation delay time, concatenated in a plurality of stages; and a selector that extracts a clock signal from any stage of the first voltage-controlled delay line and outputs this extracted clock signal to the first stage of the cyclic delay circuit.

The eighth invention of the present application is a digital phase control circuit that outputs one or more clock signals in which phase is controlled at a prescribed resolution with respect to received reference clock signals of a prescribed frequency and that is provided with:

a first voltage-controlled delay line that is composed of delay buffers having a first type of propagation delay time concatenated in a plurality of stages and that receives reference clock signals;

a second voltage-controlled delay line that is composed of delay buffers having a second type of propagation delay time concatenated in a plurality of stages;

a cyclic delay circuit that is connected to the input side of the second voltage-controlled delay line and that is composed of variable delay buffers concatenated in a plurality of stages; and a selector that extracts a clock signal from any stage of the first voltage-controlled delay line and outputs this extracted clock signal to the first stage of the cyclic delay circuit;

wherein the first voltage-controlled delay line and the second voltage-controlled delay line are each feedback-controlled by a respective delay locked loop;

each delay buffer of the first voltage-controlled delay line is supplied with a first delay control voltage or current that is generated for maintaining resolution by the delay locked loop that feedback-controls the first voltage-controlled delay line and a second delay control voltage or current that is generated for maintaining resolution by the delay locked loop that feedback-controls the second voltage-controlled delay line;

each variable delay buffer of the cyclic delay circuit is supplied with either the first delay control voltage or current or the second delay control voltage or current; and a switch circuit is provided for switching between whether or not the other delay control voltage or current is to be supplied whereby the propagation delay time can be switched between the first type of propagation delay time and the second type of propagation delay time;

the time difference between the first type of propagation delay time and the second type of propagation delay time is set smaller than both the first type of propagation delay time and the second type of propagation delay time; and the phases of clock signals are controlled with the time difference between the first type of propagation delay time and the second type of propagation delay time as the resolution.

The digital phase control circuit of the eighth invention of this application therefore has the merit that the resolution is smaller than the delay times of the delay buffers because the time difference between the first type of propagation delay time and the second type of propagation delay time is set smaller than both the first type of propagation delay time and the second type of propagation delay time, and the phases of clock signals are controlled with the time difference between the first type of propagation delay time and the second type of propagation delay time as the resolution. This invention therefore has the merit of enabling a resolution that is smaller than the minute delay time that is the limit of the delay buffers.

In addition, since there is no need to decrease the delay time (increase the speed) of the delay buffers in order to obtain smaller resolution, there is no drawback that the number of delay buffers must be increased in order to obtain smaller resolution.

The invention therefore has the merits of avoiding the increase in power consumption that accompanies higher speed of the delay buffers, the increase in power consumption that accompanies increase in the number of delay buffers, and further, the increase in area occupied by circuits that accompanies increase in the number of delay buffers, thereby enabling a power-saving, compact, high-resolution digital phase control circuit.

Furthermore, since there is no need to decrease the delay time (increase the speed) of the delay buffers in order to obtain a smaller resolution, there is no need for high-level design or high-performance processing to obtain higher speed. The invention therefore has the merit of enabling the construction of a high-resolution digital phase control circuit without increasing the design load or processing load.

The invention affords the additional advantages of enabling operation below a fixed frequency with high reliability and continuous control of clock signals at a resolution (delay time) that is accurate and free of discrepancies.

In particular, the digital phase control circuit of the eighth invention of the present application has the merits of suppressing variations in the propagation delay times that arise due to positions of the delay buffers and improving the accuracy of resolution because each variable delay buffer of the cyclic delay circuit is supplied with one of a first delay control voltage or current and a second delay control voltage or current, and is selectively supplied with the other delay control voltage or current.

In addition, the invention has the merit of enabling the construction of a high-resolution digital phase control circuit having few buffers and selectors by adopting variable delay buffers in which the propagation delay time can be switched between a first type of propagation delay time and a second type of propagation delay time.

Since only one selector is employed, the invention has the merit of eliminating the harmful effects arising from variations in switch timing of a plurality of selectors.

The ninth invention of the present application is a digital phase control circuit of any one of the first to eighth inventions of the present application in which the resolution is set to 1/n (where n is an integer) of the period of the reference clock signals.

The present invention according to the foregoing description has the following advantages:

The present invention is provided with prescribed numbers of two or more types of delay buffers each having a different propagation delay time, and, by varying the numbers of each of the types of delay buffers through which clock signals are passed, controls the phases of the clock signals by changing, in units that are more minute than the propagation delay times of the delay buffers, the total delay time of the clock signals. The present invention therefore has the merit that resolution is even smaller than the delay time of the delay buffers. The invention therefore has the merit of enabling a resolution to be obtained that is even smaller than the minute delay time that is the limit of the delay buffers.

Eliminating the need to decrease the delay time (increase the speed) of the delay buffers in order to obtain a smaller resolution eliminates the drawback that the number of delay buffers must be increased to obtain a smaller resolution.

The invention therefore has the merits of avoiding the increase in power consumption that accompanies higher speed of delay buffers, the increase in power consumption that accompanies increase in the number of delay buffers, and further, the increase in area occupied by circuits that accompanies increase in the number of delay buffers, thereby enabling a power-saving, compact, high-resolution digital phase control circuit.

Furthermore, since there is no need to decrease the delay time (increase the speed) of the delay buffers in order to obtain a smaller resolution, there is no need for high-level design or high-performance processing to obtain higher speed. The invention therefore has the merit of enabling the construction of a high-resolution digital phase control circuit without increasing the design load or processing load.

The above and other objects, features, and advantages of the present invention will become apparent from the following description based on the accompanying drawings which illustrate examples of preferred embodiments of the present invention.

DETAILED DESCRIPTION OF THE PREFERRED EMBODIMENTS

Referring now to the accompanying figures, digital phase control circuits according to embodiments of the present invention are next explained. The following explanations relate to embodiments of the present invention and do not limit the present invention.

First Embodiment

Figure 1:
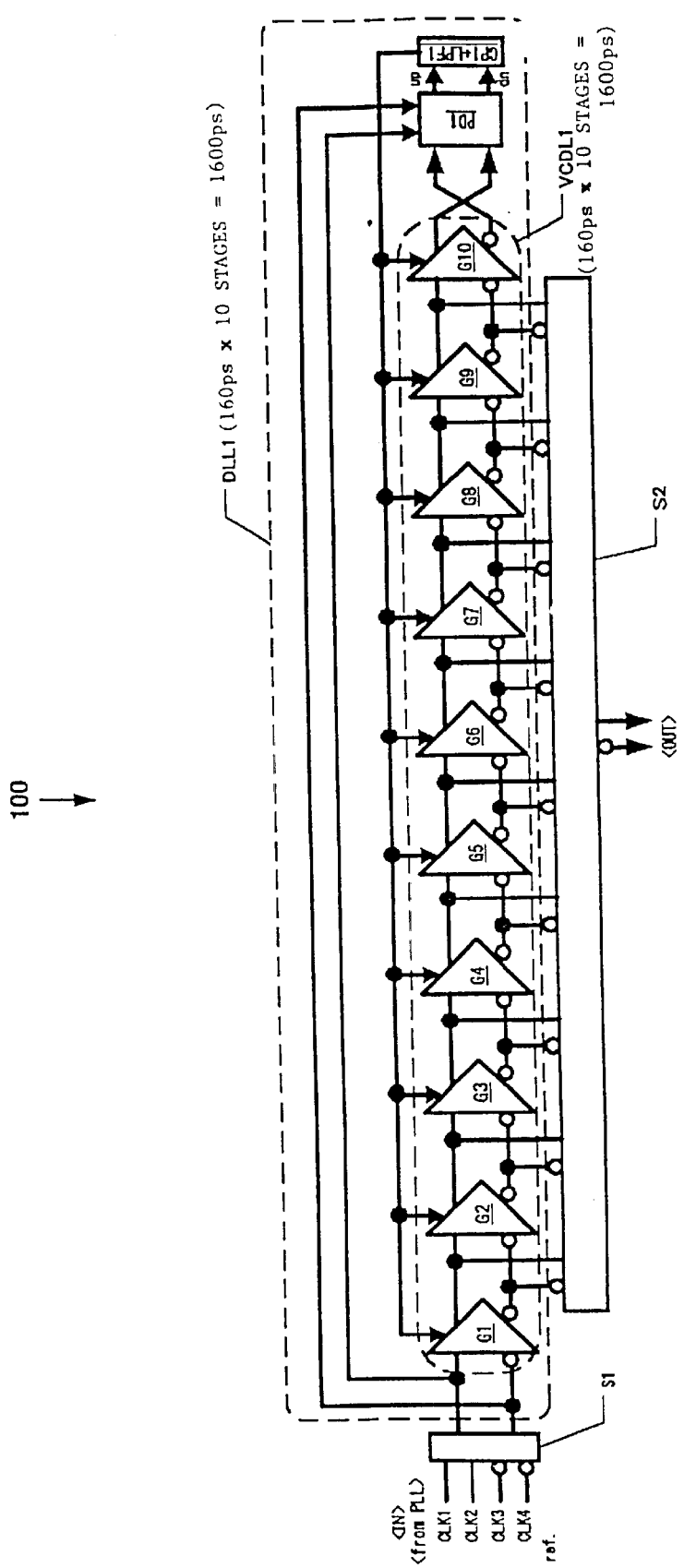
FIG. 1 is a circuit diagram of digital phase control circuit 100, which is an example of the prior art.
Figure 2:
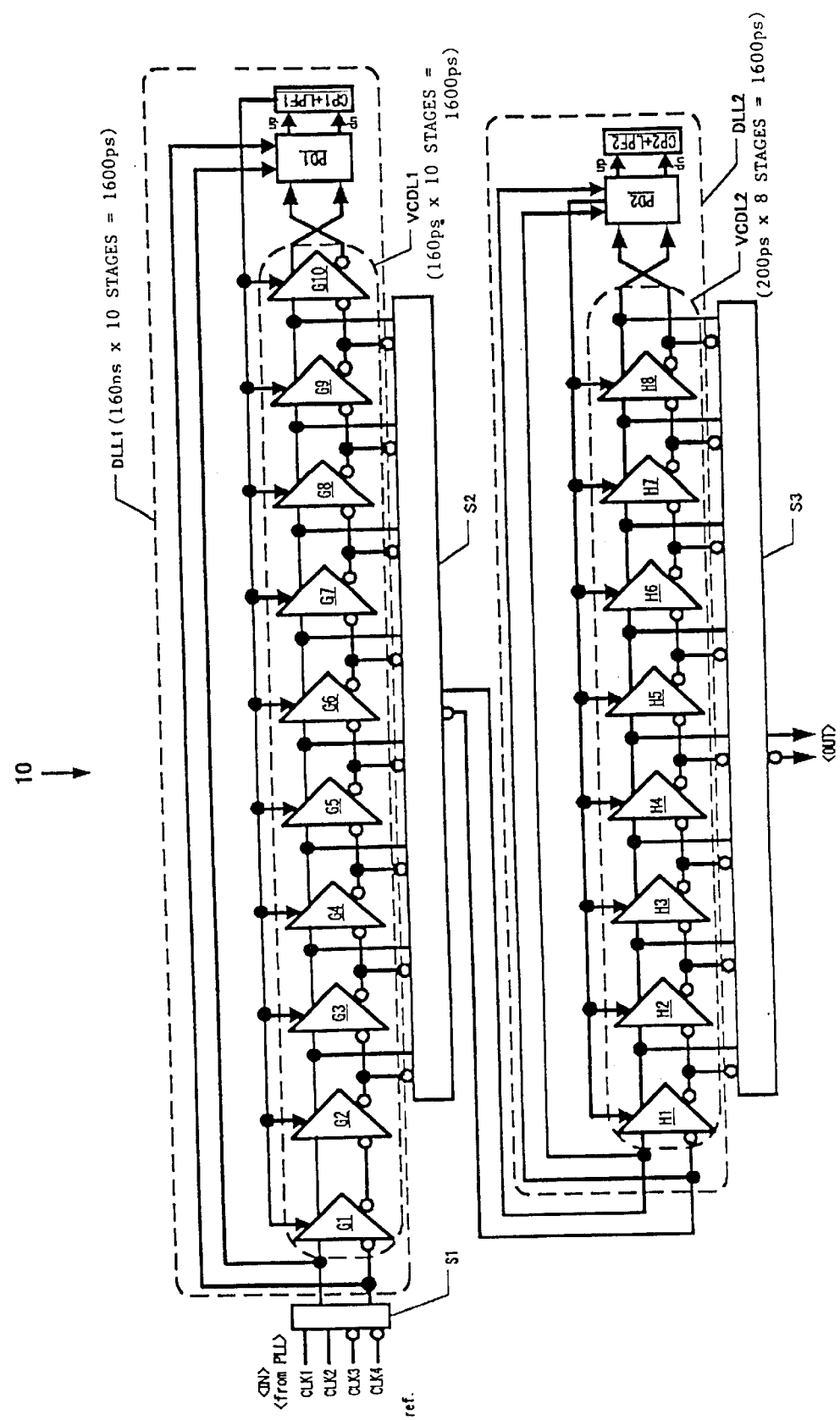
FIG. 2 is a circuit diagram showing digital phase control circuit 10 of the first embodiment of the present invention.

Referring first to FIG. 2, digital phase control circuit 10 according to the first embodiment of the present invention is explained. FIG. 2 is a circuit diagram showing digital phase control circuit 10 of the first embodiment of the present invention. The first embodiment is an example in which the resolution is set to 1/80 of the period of the reference clock signal.

Digital phase control circuit 10 of the first embodiment is a digital phase control circuit that outputs one or more clock signals in which phase is controlled at a prescribed resolution with respect to received reference clock signals of a prescribed frequency, and is provided with:

first voltage-controlled delay line (VCDL1) that is composed of differential buffers (G1–G10) having a first type of propagation delay time (160 ps) concatenated in a plurality of stages (10 stages) and that receives reference clock signals;

second voltage-controlled delay line (VCDL2) that is composed of differential buffers (H1–H8) having a second propagation delay time (200 ps) concatenated in a plurality of stages (8 stages);

selector (S2) that extracts a clock signal from any stage of first voltage-controlled delay line (VCDL1) and outputs the extracted and selected clock signal to the first stage of second voltage-controlled delay line (VCDL2); and selector (S3) that extracts and outputs the clock signal from any stage of second voltage-controlled delay line (VCDL2);

wherein first voltage-controlled delay line (VCDL1) and second voltage-controlled delay line (VCDL2) are feedback-controlled by delay locked loops (DLL1 and DLL2);

the time difference (40 ps) between the first type of propagation delay time (160 ps) and the second type of propagation delay time (200 ps) is set smaller than both the first type of propagation delay time (160 ps) and the second type of propagation delay time (200 ps); and the phases of the clock signals are controlled with the time difference (40 ps) between the first type of propagation delay time (160 ps) and the second type of propagation delay time (200 ps) as the resolution.

Referring to FIG. 2, as with digital phase control circuit 100 of the prior-art example, digital phase control circuit 10 of the first embodiment is constructed such that input selector S1 having four input terminals is connected to delay locked loop DLL1 that contains voltage-controlled delay line VCDL1 that is in turn constituted by ten stages of differential buffers G1–G10 each having a propagation delay time of 160 ps, and moreover, such that selector S2 is connected to the output of each of differential buffers G1–G10.

However, in contrast with digital phase control circuit 100 of the prior-art example, digital phase control circuit 10 of the first embodiment is constructed such that delay locked loop DLL2, which contains voltage-controlled delay line VCDL2 that is in turn constituted by eight stages of differential buffers H1–H8 each having a propagation delay time of 200 ps, is connected to the output of selector S2, and moreover, such that output selector S3 is connected to the outputs of each differential buffer H1–H8 of voltage-controlled delay line VCDL2.

Delay locked loop DLL1 is constituted by: voltage-controlled delay line VCDL1, phase detector PD1, charge pump CP1, and low-pass filter LPF1.

Delay locked loop DLL2 is constituted by: voltage-controlled delay line VCDL2, phase detector PD2, charge pump CP2, and low-pass filter LPF2.

The operation of digital phase control circuit 10 of the first embodiment is next described using numerical values.

As with digital phase control circuit 100 of the prior-art example, 325.5-MHz (3200-ps period) clock signals CLK1–CLK4 (reference clocks) having phase differences of 800 ps are supplied in four phases to the four input terminals IN of selector S1. These clock signals CLK1–CLK4 are controlled in advance by, for example, a phase-locked loop not shown in the figure such that the frequencies of the four clock signals CLK1–CLK4 and the phase differences (800 ps) between each of the clock signals are equal, and are then supplied to input terminals IN.

Selector S1 selects and extracts a particular differential pair from the plurality of input terminals IN. In other words, selector S1 selects one pair of differential clock signals from among the four types of differential clock signals CLK1-3, CLK3-1, CLK2-4, and CLK4-2, and outputs to voltage-controlled delay line VCDL1 and phase detector PD1.

The ten stages of differential buffers G1–G10 that make up voltage-controlled delay line VCDL1 each have a propagation delay time of 160 ps and are controlled by the feedback control of delay locked loop DLL1 such that their delay times are uniform. In other words, the period of voltage-controlled delay line VCDL1 is constantly corrected to 160 ps×10 stages=1600 ps.

The eight stages of differential buffers H1–H8 that constitute voltage-controlled delay line VCDL2 each have a propagation delay time of 200 ps and are controlled by the feedback control of delay locked loop DLL2 such that their delay times are uniform. In other words, the period of voltage-controlled delay line VCDL2 is constantly corrected to 200 ps×8 stages=1600 ps.

As a result of the combined selections by the three selectors S1, S2, and S3, a clock signal having a resolution of 40 ps with respect to the reference clocks is outputted from output terminals OUT.

The three selectors S1, S2, and S3 are circuits that each select and extract a particular differential pair from the plurality of input terminals.

For example, as a base state, differential buffer G5 in voltage-controlled delay line VCDL1 is selected by selector S2, and differential buffer H4 in voltage-controlled delay line VCDL2 is selected by selector S3. At this time, the delay in voltage-controlled delay line VCDL1 is 160 ps×5 stages=800 ps and the delay in voltage-controlled delay line VCDL2 is 200 ps×4 stages=800 ps for a total of 1600 ps, if the delay of the three selectors S1, S2, and S3 is ignored.

In contrast with this base state, if differential buffer G4 in voltage-controlled delay line VCDL1 is selected by selector S2, and differential buffer H5 in voltage-controlled delay line VCDL2 is selected by selector S3, the delay in voltage-controlled delay line VCDL1 is 160 ps×4=640 ps and the delay in voltage-controlled delay line VCDL2 is 200 ps×5= 1000 ps, whereby the total delay time is 1640 ps, if the delay of the three selectors S1, S2, and S3 is ignored. In other words, the delay (phase) is delayed by a resolution of 40 ps with respect to the total delay of the base state.

The phase of the clock signal can be easily further delayed by the selection of a differential buffer of a lower number by selector S2 in voltage-controlled delay line VCDL1 and the selection of a differential buffer of higher number by selector S3 in voltage-controlled delay line VCDL2. Alternatively, the phase of the clock signal can be advanced by the selection of a differential buffer of higher number by selector S2 in voltage-controlled delay line VCDL1 and the selection of a differential buffer of lower number by selector S3 in voltage-controlled delay line VCDL2.

Referring now to FIG. 2 and Table 1, the operation of digital phase control circuit 10 of the first embodiment is further explained.

Table 1 shows each of the selection states of selectors S1, S2, and S3, the delay time of each unit, and the total delay time when using digital phase control circuit 10 of the first embodiment to delay phase. This table shows the control of the phases of clock signals by dividing the period (3200 ps) of the reference clocks into 80 equal portions at a resolution of 40 ps. In other words, this table shows that the clock phase of output signals can be uniformly and continuously tracked at a fixed resolution with respect to the period of the reference clocks.

[Table 1]

As shown in Table 1, in state <111>, differential clock signals CLK1-3 are selected by selector S1, the output of differential buffer G5 of voltage-controlled delay line VCDL1 is selected by selector S2, and the output of differential buffer H1 of voltage-controlled delay line VCDL2 is selected by selector S3. Thus, in state <111>, the delay of differential clock signals CLK1-3 that is outputted from selector S1 is 0 ps, the delay in voltage-controlled delay line VCDL1 is 800 ps, and the delay in voltage-controlled delay line VCDL2 is 200 ps. As a result, the total delay is 1000 ps.

In state <112>, differential clock signals CLK1-3 are selected by selector S1, the output of differential buffer G4 of voltage-controlled delay line VCDL1 is selected by selector S2, and the output of differential buffer H2 of voltage-controlled delay line VCDL2 is selected by selector S3. Thus, in state <112>, the delay of differential clock signals CLK1-3 that is outputted from selector S1 is 0 ps, the delay in voltage-controlled delay line VCDL1 is 640 ps, and the delay in voltage-controlled delay line VCDL2 is 400 ps. As a result, the total delay is 1040 ps, the phase being delayed 40 ps with respect to state <111>. Accordingly, if the phase of the outputted clock signal during state <111>is advanced 40 ps with respect to the desired phase, a clock signal of the desired phase can be outputted from output terminal OUT by switching to state <112>.

In cases in which the phase is to be further delayed in the same way, the clock signal can be continuously controlled at a resolution of 40 ps by switching the selections of selectors S2 and S3 as follows: from state <113>to state<154>and from state <211>to state <254>, as shown in Table 1.

Further, the phase can be delayed 40 ps with respect to state <254>upon switching to state <311>.

As shown in Table 1, in state <311>, differential clock signals CLK3-1 are selected by selector S1, the output of differential buffer G5 of voltage-controlled delay line VCDL1 is selected by selector S2, and the output of differential buffer H1 of voltage-controlled delay line VCDL2 is selected by selector S3. Accordingly, in state <311>, the delay of differential clock signals CLK3-1 that is outputted from selector S1 is 1600 ps, the delay in voltage-controlled delay line VCDL1 is 800 ps, and the delay of voltage-controlled delay line VCDL2 is 200 ps. The total delay is consequently 2600 ps.

In state <312>, differential clock signals CLK3-1 are selected by selector S1, the output of differential buffer G4 of voltage-controlled delay line VCDL1 is selected by selector S2, and the output of differential buffer H2 of voltage-controlled delay line VCDL2 is selected by selector S3. Accordingly, in state <312>, the delay of differential clock signals CLK3-1 that is outputted from selector S1 is 1600 ps, the delay in voltage-controlled delay line VCDL1 is 640 ps, and the delay in voltage-controlled delay line VCDL2 is 400 ps. The total delay is consequently 2640 ps, the phase being delayed 40 ps with respect to state <311>.

In cases in which the phase is to be further delayed in the same way, the clock signal can be continuously controlled at a resolution of 40 ps by switching the selections of selectors S2 and S3 as follows: from state <313>to state <354>and from state <411>to state <454>, as shown in Table 1.

Furthermore, following state <454>, the clock signal can be continuously controlled at a resolution of 40 ps by switching to state <111>.

The phase of the clock signals can be advanced at a resolution of 40 ps if states <111>-<454> are switched in the reverse order of the order described above. Alternatively, the circuit may be operated as shown in Table 2. Table 2 shows each of the selection states of selectors S1, S2, and S3, the delay times of each unit, and the total delay time for a case in which digital phase control circuit 10 of the first embodiment is used to advance phase.

[Table 2]

As described in the foregoing explanation, clock signals can be continuously controlled at a resolution of 40 ps by digital phase control circuit 10 of the first embodiment. Resolution can be made one fourth that of digital phase control circuit 100 of the prior-art example.

Although digital phase control circuit 10 of the first embodiment includes two voltage-controlled delay lines, the present invention is not limited to this form, and a digital phase control circuit may be constructed in which three or more voltage-controlled delay lines having differential buffers of different propagation delay times are connected by selectors, and that, by varying the numbers of each type of differential buffer through which clock signals are passed, controls the phases of clock signals by changing the total delay time in units that are more minute than the propagation delay times of the differential buffers.

Furthermore, although two types of differential buffers having propagation delay times of 160 ps and 200 ps were used to produce a resolution of 40 ps in digital phase control circuit 10 of the first embodiment, the present invention is not limited to this form. According to the present invention, a digital phase control circuit can be constructed that controls phase at an even more minute resolution.

Second Embodiment

Figure 3:
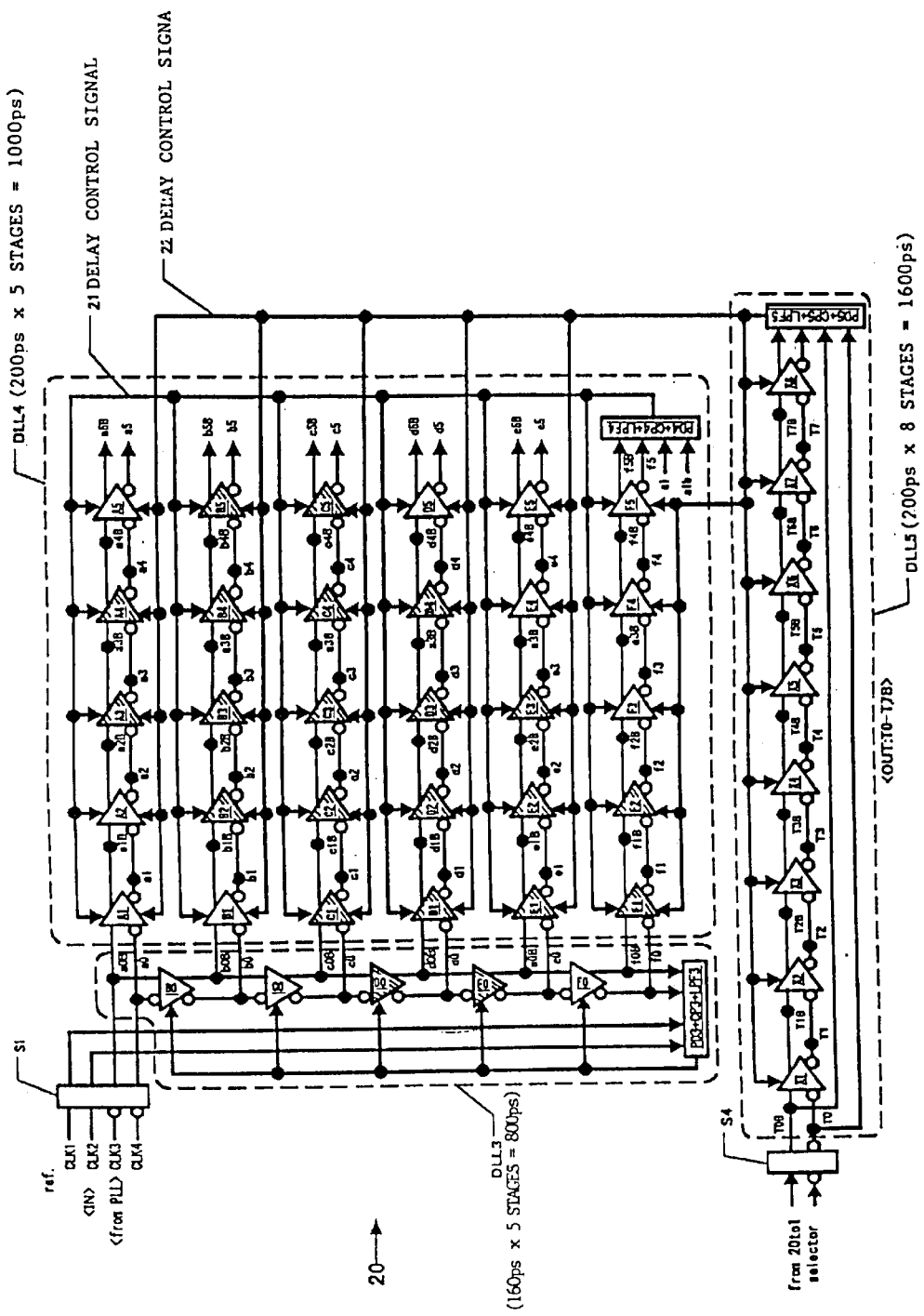
FIG. 3 is a circuit diagram showing digital phase control circuit 20 of the second embodiment of the present invention.

Referring now to FIG. 3, digital phase control circuit 20 of the second embodiment of the present invention is next explained. FIG. 3 is a circuit diagram showing digital phase control circuit 20 of the second embodiment of the present invention. The second embodiment is an example in which the resolution is set to 1/80 the period of the reference clock signals.

Digital phase control circuit 20 of the second embodiment is a digital phase control circuit that outputs one or more clock signals in which phase is controlled at a prescribed resolution with respect to received reference clock signals of a prescribed frequency and is provided with:

a first voltage-controlled delay line (a voltage-controlled delay line composed of differential buffers B0–F0) that is composed of differential buffers (B0–F0) having a first type of propagation delay time (160 ps) concatenated in h stages (h=5) and that receives reference clock signals;

i (i=6) second voltage-controlled delay lines (voltage-controlled delay lines composed of differential buffers A1–A5, B1–B5, C1–C5, D1–D5, E1–E5 or F1–F5) that are each composed of differential buffers (A1–A5, B1–B5, C1–C5, D1–D5, E1–E5, and F1–F5) having a second type of propagation delay time (200 ps) concatenated in j stages (j=5), each voltage-controlled delay line being connected to a respective output of i stages (i=6) of outputs of the first voltage-controlled delay line;

a third voltage-controlled delay line (a voltage-controlled delay line composed of differential buffers X1–X8) that is composed of differential buffers (X1–X8) having the second type of propagation delay time (200 ps) concatenated in k stages (k=8); and a selector (S4) that extracts a clock signal from any stage (a0, a0B-f5, f5B) of the first voltage-controlled delay line and second voltage-controlled delay lines and outputs this extracted clock signal to the first stage of the third voltage-controlled delay line;

wherein the first voltage-controlled delay line and the third voltage-controlled delay line are each feedback-controlled by a respective delay locked loop (DLL3 and DLL5); and a delay control voltage or current (delay control signal 22) that is generated for maintaining resolution by the delay locked loop (DLL5) that feedback-controls the third voltage-controlled delay line is supplied to each differential buffer (A1–F5) of each second voltage-controlled delay line;

the time difference (40 ps) between the first type of propagation delay time (160 ps) and the second type of propagation delay time (200 ps) is set smaller than both the first type of propagation delay time (160 ps) and the second type of propagation delay time (200 ps); and the phases of clock signals are controlled with the time difference (40 ps) between the first type of propagation delay time (160 ps) and the second type of propagation delay time (200 ps) as the resolution.

In addition, at least one of the voltage-controlled delay lines (voltage-controlled delay lines composed of differential buffers F1–F5) of the second voltage-controlled delay lines (voltage-controlled delay lines composed of differential buffers A1–A5, B1–B5, C1–C5, D1–D5, E1–E5 or F1–F5) is feedback-controlled by a delay locked loop (DLL4); and a delay control voltage or current (delay control signal 21) that is generated for maintaining resolution by the delay locked loop (DLL4) that feedback-controls the one voltage-controlled delay line is supplied to each differential buffer (A1–E5) of the other second voltage-controlled delay lines (voltage-controlled delay lines that are composed of differential buffers A1–A5, B1–B5, C1–C5, D1–D5 or E1–E5), whereby the phases of the clock signals are controlled.

Delay locked loop DLL3 is provided with phase detector PD3, charge pump CP3, and low-pass filter LPF3.

Delay locked loop DLL4 is provided with phase detector PD4, charge pump CP4, and low-pass filter LPF4.

The operation of digital phase control circuit 20 of the second embodiment is next explained using numerical values.

As with digital phase control circuit 100 of the prior-art example, 325.5-MHz (3200-ps period) clock signals CLK1–CLK4 (reference clocks) are supplied in four phases with phase differences of 800 ps to the four input terminals IN of selector S1. These clock signals CLK1-4 are controlled in advance by, for example, a phase-locked loop not shown in the figure such that the frequencies of the four clock signals CLK1-4 and the phase differences (800 ps) between each of the clock signals are equal, and are then supplied to input terminals IN.

Selector S1 selects and extracts a particular differential pair from the plurality of input terminals IN. In other words, selector S1 selects one pair of differential clock signals from among the four types of differential clock signals CLK1-3, CLK3-1, CLK2-4, and CLK4-2, and outputs to differential buffers A1 and B0 and phase detector PD3.

Delay locked loop DLL3 is provided with a voltage-controlled delay line that is constituted by five stages of differential buffers B0–F0. These five stages of differential buffers B0–F0 each have a propagation delay time of 160 ps, and are controlled by the feedback control of delay locked loop DLL3 such that their delay times are uniform. In other words, delay locked loop DLL3 is feedback-controlled such that the total delay of the five stages of differential buffers B0–F0 has the same phase as a signal in which the phase is shifted ¼ period (800 ps) from the reference clock, and the period 160 ps×5 stages=800 ps is constantly corrected.

Selector S4 is a circuit for selecting one pair of outputs from 22 pairs of outputs (the outputs of differential buffers that are shaded in the figure) among the total of 36 pairs of outputs a0, a0B-f5, f5B.

Delay locked loop DLL5 is provided with a voltage-controlled delay line that is constituted by eight stages of differential buffers X1–X8, and is supplied with an output signal that is selected by selector S4. These eight stages of differential buffers X1–X8 each have a propagation delay time of 200 ps and are controlled by the feedback control of delay locked loop DLL5 such that their delay times are uniform. In other words, the period of delay locked loop DLL5 is constantly corrected to 200 ps×8 stages=1600 ps.

The thirty differential buffers A1–F5 are each constituted by buffers that are of the same form and same propagation delay time as differential buffers X1–X8 in delay locked loop DLL5. Delay control signal 22 of delay locked loop DLL5 is supplied to these differential buffers A1–F5, and their propagation delay times are thus maintained at 200 ps.

The 200-ps propagation delay time of differential buffers A1–F5 is again corrected by the feedback control of delay locked loop DLL4. The feedback control of delay locked loop DLL4 is performed as follows:

Phase detector PD4 receives both: a differential clock signal from output f5, f5B that has passed through differential buffers B0–F0 and differential buffers F1–F5 and has a total delay of 1800 ps; and a differential clock signal from output a1, a1B that has passed through differential buffer A1 and has a total delay of 200 ps; compares the phases of these signals; detects the phase error; and outputs an UP signal or a DOWN signal to charge pump CP4.

Charge pump CP4 and low-pass filter LPF4 generate delay control signal 21 so as to maintain a propagation delay time of 200 ps in accordance with the signal from phase detector PD4 and sends [delay control signals 21 ] to each of differential buffers A1–F5.

Delay control voltages or currents that are generated for maintaining resolution by two delay locked loops DLL4 and DLL5 are thus supplied to differential buffers A1–F5, thereby suppressing variations in the propagation delay times of the differential buffers that arise from the positions of the differential buffers and correcting for accurate resolution.

Although two delay locked loops DLL4 and DLL5 are employed in digital phase control circuit 20 of the second embodiment, a single delay locked loop DLL5 may be used. However, the use of delay locked loop DLL4 enables the correction of the delay error between differential buffers X1–X8 in delay locked loop DLL5 and differential buffers A1–F5. Delay locked loop DLL5, which corrects the 200-ps delay, also serves to output clock signals of a total of 16 phases (differential pairs of 8 phases) from output terminals T0, T0B-T7, T7B, and according to the use of these clocks of 16 phases, in some cases is advantageously arranged in a position that is close to the clock supply destination. In such cases, even though delay locked loop DLL5 may be arranged at a distance from differential buffers A1–F5 and variations may therefore occur in the propagation delay time of differential buffers A1–F5, the use of delay locked loop DLL4 allows the correction of the propagation delay times of differential buffers A1–F5 by the feedback of delay locked loop DLL4.

Phase detector PD4 receives differential clock signals having a total delay of 200 ps with respect to the reference clock signal from a relatively remote output a1, a1B in order to mitigate variations in the propagation delay time of differential buffers that are caused by position.

The operation of digital phase control circuit 20 of the second embodiment is further explained with reference to FIG. 3, Table 3, and Table 4.

Digital phase control circuit 20 of the second embodiment is a circuit directed to outputting changes of a 40-ps minute delay time (resolution) both continuously and in the same period (40 ps (40=1600 ps) units as the reference clock.

Table 3 shows the relation between the buffer array of digital phase control circuit 20 of the second embodiment and the delay times of the output clock signals [of the buffer array]. The shaded portion of Table 3 corresponds to the shaded portion of FIG. 3.

[Table 3]
Table 4 shows each selection state of selectors S1 and S4, the delay time of each unit, and the total delay time in a case of using digital phase control circuit 20 of the second embodiment to delay phase. This table shows the control of the phase of clock signals by evenly dividing the reference clock period (3200 ps) into 80 equal portions at a resolution of 40 ps. In other words, the phase of an outputted clock signal can be uniformly and continuously tracked at a fixed resolution with respect to the period of the reference clock.

For the sake of convenience, output terminal OUT is limited to only output T0, T0B and the delay of selector S1 and selector S4 is ignored in Table 4.

[Table 4]
As shown in Table 4, in state <111>, differential clock signals CLK1-3 are selected by selector S1 and the output d0, d0B of differential buffer D0 is selected by selector S4. Accordingly, in state <111>, the delay of differential clock signals CLK1-3 that is outputted from selector S1 is 0 ps, and the delay resulting from differential buffers B0–D0 is 480 ps. The total delay is therefore 480 ps.

In state <112>, differential clock signals CLK1-3 are selected by selector S1 and output c1, c1B of differential buffer C1 is selected by selector S4. The delay of differential clock signals CLK1-3 that is outputted from selector S1 is therefore 0 ps, and the delay resulting from differential buffers B0, C0, and C1 is 520 ps. As a result, the total delay is 520 ps, and the phase is delayed 40 ps with respect to state <111>. Thus, if the phase of an outputted clock signal during state <111>is advanced 40 ps with respect to the desired phase, a clock signal of the desired phase can be outputted from output terminal OUT by switching to state <112>.

In a case in which the phase is to be further delayed in the same way, the clock signal can be continuously controlled at a resolution of 40 ps by switching the selections of selector S4 as follows: from state <113>to state <154>, as shown in Table 4.

The phase can be delayed 40 ps with respect to state <154>upon switching to state <211>.

In state <211>, differential clock signals CLK2-4 are selected by selector S1, and output d0, d0B of differential buffer D0 is selected by selector S4, as shown in Table 4. Accordingly, in state <211>, the delay of differential clock signals CLK2-4 that is outputted from selector S1 is 800 ps, and the delay resulting from differential buffers B0–D0 is 480 ps. As a result, the total delay is 1280 ps.

In a case in which the phase is to be further delayed in the same way, the selection of selector S4 is changed as follows: from state <212>to state <254>; and by further selecting differential clock signals CLK3-1 by selector S1, the selection of selector S4 is switched as follows: from state <311>to state <354>, as shown in Table 4.

Similarly, differential clock signals CLK4-2 are selected by selector S1, and the selection of selector S4 is switched as follows: from state <411>to state <454>.

After state <454>, the clock signals can be controlled continuously at a resolution of 40 ps by switching to state <111>.

The phase of clock signals can be advanced at a resolution of 40 ps if states <111>-<454>are switched in the reverse order of the above-described order.

As described in the foregoing explanation, digital phase control circuit 20 of the second embodiment enables continuous control of clock signals at a resolution of 40 ps. This invention enables a reduction of the resolution to ¼ that of digital phase control circuit 100 of the prior-art example.

Although there are two types of differential buffers in digital phase control circuit 20 of the second embodiment, the present invention is not limited to this form; and a digital phase control circuit may be constructed that is provided with prescribed numbers of each of three or more types of differential buffers, wherein, by varying the numbers of each type of differential buffer through which clock signals are passed, the total delay time of clock signals is changed by units that are more minute than the propagation delay time of the differential buffers to control the phases of the clock signals.

Although two types of differential buffers having propagation delay times of 160 ps and 200 ps were used to produce a resolution of 40 ps in digital phase control circuit 20 of the second embodiment, the present invention is not limited to this form. According to the present invention, a digital phase control circuit can be constructed that controls the phase at a more minute resolution.

Third Embodiment

Figure 4:
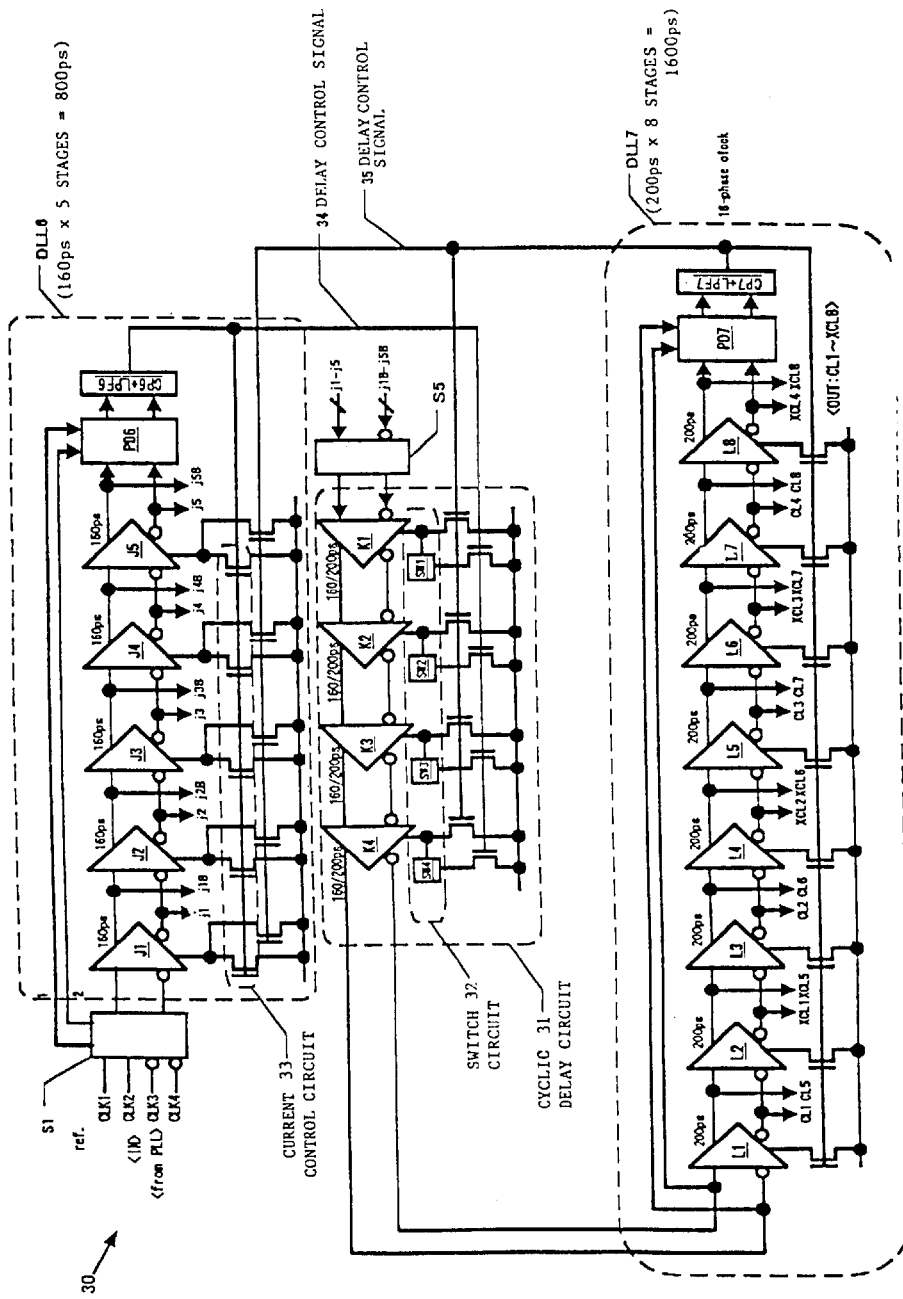
FIG. 4 is a circuit diagram showing digital phase control circuit 30 of the third embodiment of the present invention.

Referring now to FIG. 4, digital phase control circuit 30 of the third embodiment is next explained. FIG. 4 is a circuit diagram showing digital phase control circuit 30 of the third embodiment. The third embodiment is an example in which the resolution is set to 1/80 the period of the reference clock signal.

Digital phase control circuit 30 of the third embodiment is a digital phase control circuit that outputs one or more clock signals in which phase is controlled at a prescribed resolution with respect to received reference clock signals of a prescribed frequency, and is provided with:

a first voltage-controlled delay line (a voltage-controlled delay line that is composed of differential buffers J1–J5) that is composed of differential buffers (J1–J5) having a first type of propagation delay time (160 ps) concatenated in a plurality of stages (5 stages) and that receives reference clock signals;

a second voltage-controlled delay line (a voltage-controlled delay line composed of differential buffers L1–L8) that is composed of differential buffers (L1–L8) having a second type of propagation delay time (200 ps) concatenated in a plurality of stages (8 stages);

a cyclic delay circuit (31) that is connected to the input side of the second voltage-controlled delay line and that is composed of variable differential buffers (K1–K4) concatenated in a plurality of stages (4 stages); and a selector (S5) that extracts a clock signal from any stage of first voltage-controlled delay line and outputs this extracted clock signal to the first stage of the cyclic delay circuit (31);

wherein:

the first voltage-controlled delay line and the second voltage-controlled delay line are each feedback-controlled by a respective delay locked loop (DLL6 and DLL7);

each differential buffer (J1–J5) of the first voltage-controlled delay line is supplied with a first delay control voltage or current (delay control signal 34) that is generated for maintaining resolution by the delay locked loop (DLL6) that feedback-controls the first voltage-controlled delay line and a second delay control voltage or current (delay control signal 35) that is generated for maintaining resolution by the delay locked loop (DLL7) that feedback-controls the second voltage-controlled delay line;

each variable delay buffer (differential buffers K1–K4) of the cyclic delay circuit (31) is supplied with one (delay control signal 35) of the first delay control voltage or current (delay control signal 34) and the second delay control voltage or current (delay control signal 35), and a switch circuit (32) is provided for switching between supplying or not supplying the other (delay control signal 34), whereby the propagation delay time of each variable differential buffer K1–K4 can be switched between the first type of propagation delay time (160 ps) and the second type of propagation delay time (200 ps);

the time difference (40 ps) between the first type of propagation delay time (160 ps) and the second type of propagation delay time (200 ps) is set smaller than both the first type of propagation delay time (160 ps) and the second type of propagation delay time [(200 ps)]; and the phases of clock signals are controlled with the time difference (40 ps) between the first type of propagation delay time (160 ps) and the second type of propagation delay time (200 ps) as the resolution.

Delay locked loop DLL6 is provided with phase detector PD6, charge pump CP6, and low-pass filter LPF6.

Delay locked loop DLL7 is provided with phase detector PD7, charge pump CP7, and low-pass filter LPF7.

The operation of digital phase control circuit 30 of the third embodiment is next explained with numerical values.

As with digital phase control circuit 100 of the prior-art example, 325.5-MHz (3200-ps period) clock signals CLK1–CLK4 (reference clocks) are supplied in four phases with phase differences of 800 ps to the four input terminals IN of selector S1. These clock signals CLK1-4 are controlled in advance by, for example, a phase-locked loop not shown in the figure such that the frequencies of the four clock signals CLK1-4 and the phase differences (800 ps) between each of the clock signals are equal, and are then supplied to input terminals IN.

Selector S1 selects and extracts a differential pair from the plurality of input terminals IN. In other words, selector S1 selects one pair of differential clock signals from the four types of differential clock signals CLK1-3, CLK3-1, CLK2-4, and CLK4-2, and outputs to differential buffer J1 and phase detector PD6.

Delay locked loop DLL7 is provided with a voltage-controlled delay line constituted by eight stages of differential buffers L1–L8. These eight stages of differential buffers L1–L8 each have a propagation delay time of 200 ps and are controlled by the feedback control of delay locked loop DLL7 such that their delay times are uniform. In other words, the period of delay locked loop DLL7 is constantly corrected to 200 ps×8 stages=1600 ps.

Delay locked loop DLL6 is provided with a voltage-controlled delay line that is constituted by five stages of differential buffers J1–J5. These five stages of differential buffers J1–J5 each have a propagation delay of 160 ps and are controlled by delay control signal 34 that is generated by delay locked loop DLL6 and delay control signal 35 that is generated by delay locked loop DLL7 such that their delay times are uniform. Delay control signal 34 is a signal for controlling to a delay time of 40 ps, and delay control signal 35 is a signal for controlling to a delay time of 200 ps.

Delay locked loop DLL6 is supplemented with current control circuit 33 for adjusting current. The period of delay locked loop DLL6 is constantly corrected to 160 ps×5 stages=800 ps by the adding a control current for controlling to a delay time of −40 ps that is received from current control circuit 33 to a control current for controlling to a delay time of 200 ps that is generated at delay locked loop DLL7.

Selector S5 is a circuit for selecting a pair of outputs from the five pairs of outputs j1, j1B-jj5, j5B. In addition, cyclic delay circuit 31 is a circuit for generating minute delays (resolution) and moreover, adjusting these delays.

Cyclic delay circuit 31 is constituted by four stages of differential buffers K1–K4 that are formed in the same form as differential buffers J1–J5 in delay locked loop DLL6. Delay control signal 35 is constantly supplied to cyclic delay circuit 31. Switch circuit 32 is for opening and closing delay control signal 34 from delay locked loop DLL6. Switch circuit 32 is provided with switch elements SW1–SW4 for each of differential buffers K1–K4. When switch element SW1 is OFF (closed), differential buffer K1 receives only delay control signal 35 and its propagation delay time becomes 200 ps. When switch element SW1 is ON (open), differential buffer K1 receives delay control signal 34 and delay control signal 35 and its propagation delay time becomes 160 ps. The relation between the operation of switch elements SW2–SW4 and the propagation delay times of differential buffers K2–K4 is equivalent.

Clock signals of a total of 16 phases (differential pairs of 8 phases) having a resolution of 40 ps with respect to the reference clocks are simultaneously outputted from output terminals CL1, XCL1-CL8, XCL8.

The operation of digital phase control circuit 30 of the third embodiment is further explained with reference to FIG. 4 and Table 5.

Digital phase control circuit 30 of the third embodiment is a circuit directed to outputting changes of minute delay times (resolution) of 40 ps both continuously and in units of the same period (40 ps×40=1600 ps) as the reference clocks.

Table 5 shows each of the selection states of selectors S1 and S5, the delay time of each unit, and the total delay time in a case in which digital phase control circuit 30 of the third embodiment is used to delay phase. This table shows that the phases of clock signals are controlled by evenly dividing the period (3200 ps) of the reference clocks into 80 equal portions with a resolution of 40 ps. In other words, the table shows that the phases of outputted clock signals can be uniformly and continuously tracked at a fixed resolution with respect to the period of the reference clock.

For the sake of convenience, output terminals OUT are limited to only output XCL4, XCL8 of FIG. 4 and the delay of selector S1 and selector S5 is ignored in Table 5.

[Table 5]

As shown in Table 5, in state <111>, differential clock signals CLK1-3 are selected by selector S1, output j1, j1B of differential buffer J1 is selected by selector S5, switch element SW1 is OFF, and switch elements SW2–SW4 are ON. Accordingly, in state <111>, the delay of differential clock signals CLK1-3 that is outputted from selector S1 is 0 ps, the delay resulting from differential buffer J1 is 160 ps, the delay resulting from cyclic delay circuit 31 is 680 ps (of which 200 ps results from differential buffer K1 and 160 ps×3=480 ps results from differential buffers K2–K4), and the delay resulting from differential buffers L1–L8 is 200 ps×8=1600 ps. The total delay is therefore 2440 ps.

In state <112>, differential clock signals CLK1-3 are selected by selector S1, output j1, j1B of differential buffer J1 is selected by selector S5, switch elements SW1 and SW2 are OFF, and switch elements SW3 and SW4 are ON. Accordingly, in state <112>, the delay of differential clock signals CLK1-3 that is outputted from selector S1 is 0 ps, the delay resulting from differential buffer J1 is 160 ps, the delay resulting from cyclic delay circuit 31 is 720 ps (of which, the delay that results from differential buffers K1 and K2 is 200 ps×2=400 ps, and the delay that results from differential buffers K3 and K4 is 160 ps×2=320 ps), and the delay resulting from differential buffers L1–L8 is 200 ps×8=1600 ps. The total delay is therefore 2480 ps. Accordingly, if the phase of an outputted clock signal is advanced 40 ps with respect to the desired phase during state <111>, a clock signal of the desired phase can be outputted from output terminal OUT by switching to state <112>.

In state <113>, differential clock signals CLK1-3 are selected by selector S1, output j1, j1B of differential buffer J1 is selected by selector S5, switch elements SW1–SW3 are OFF, and switch element SW4 is ON. Accordingly, in state <113>, the delay of differential clock signals CLK1-3 that is outputted from selector S1 is 0 ps, the delay resulting from differential buffer J1 is 160 ps, the delay resulting from cyclic delay circuit 31 is 760 ps (of which, the delay resulting from differential buffers K1–K3 is 200 ps×3=600 ps, and the delay resulting from differential buffer K4 is 160 ps), and the delay resulting from differential buffers L1–L8 is 200 ps×8 =1600 ps.

The total delay is therefore 2520 ps. Accordingly, if the phase of an outputted clock signal is advanced 80 ps with respect to the desired phase during state <111>, a clock signal of the desired phase can be outputted from output terminal OUT by switching to state <113>.

In a case in which the phase is further delayed in the same way, the clock signal can be continuously controlled at a resolution of 40 ps by switching selector S5 and switch circuit 32 as follows: from state <114>to state <154>, as shown in Table 5. Further, the phase can be delayed by 40 ps with respect to state <154>upon switching to state <211>

As shown in Table 5, in state <211>, differential clock signals CLK2-4 are selected by selector S1, output j1, j1B of differential buffer J1 is selected by selector S5, switch element SW1 is OFF, and switch elements SW2–SW4 are ON. Accordingly, in state <211>, the delay of differential clock signals CLK2-4 that is outputted from selector S1 is 800 ps, the delay resulting from differential buffer J1 is 160 ps, the delay resulting from cyclic delay circuit 31 is 680 ps (of which, the delay resulting from differential buffer K1 is 200 ps, and the delay resulting from differential buffers K2–K4 is 160 ps×3=480 ps), and the delay resulting from differential buffers L1–L8 is 200 ps×8=1600 ps. The total delay is therefore 3240 ps.

In a case in which the phase is to be further delayed in the same way, selector S5 and switch circuit 32 are switched as follows: from state <212>to state <254>; and further, differential clock signals CLK3-1 are selected by selector S1, and selector S5 and switch circuit 32 are switched as follows: from state <311>to state <354>, as shown in Table 5.

Similarly, differential clock signals CLK4-2 are selected by selector S1, and selector S5 and switch circuit 32 are switched as follows: from state <411>to state <454>.

Following state <454>, the clock signals can be further continuously controlled at a resolution of 40 ps by switching to state <111>.

If states <111>-<454> are switched in the reverse order of the above-described order, the phase of clock signals can be advanced at a resolution of 40 ps. Table 6 shows each of the selection states of selectors S1 and S5, the delay time of each unit, and the total delay time for a case in which digital phase control circuit 30 of the third embodiment is used to advance phase (the opposite order of Table 5).

[Table 6]

As described hereinabove, digital phase control circuit 30 of the third embodiment enables continuous control of clock signals at a resolution of 40 ps. This embodiment enables a resolution that is ¼ that of digital phase control circuit 100 of the prior-art example, and in addition, has the merits of suppressing variation in the propagation delay times of differential buffers arising from the positions of the differential buffers, and improving resolution accuracy. The construction of a high-resolution digital phase control circuit having a limited number of buffers and selectors is made possible by adopting variable delay buffers (differential buffers K1–K4) that are capable of switching propagation delay time between a first type of propagation delay time (160 ps) and a second type of propagation delay time (200 ps). Since there is only one selector, the invention has the merit of eliminating the harmful effects arising from discrepancies in switch timing of a plurality of selectors.

Although there are two types of differential buffers in digital phase control circuit 30 of the third embodiment, the present invention is not limited to this form. According to the present invention, a digital phase control circuit may be constructed that is provided with prescribed numbers of each of three or more types of delay buffers, and that, by varying the numbers of each of the types of buffers through which clock signals are caused to pass, changes the total delay time of the clock signals in more minute units than the propagation delay time of the delay buffers so as to control the phase of the clock signals.

Finally, although digital phase control circuit 30 of the third embodiment employs two types of delay buffers having propagation delay times of 160 ps and 200 ps to produce a resolution of 40 ps, the present invention is not limited to this form. According to the present invention, a digital phase control circuit can be constructed that controls phase at an even finer resolution.

While preferred embodiments of the present invention have been described using specific terms, such description is for illustrative purposes only, and it is to be understood that changes and variations may be made without departing from the spirit or scope of the following claims.

TABLE 1

| | <111> | <112> | <113> | <114> | <121> | <122> | <123> | <124> | <131> | <132> | <133> | <134> | <141> | <142> | <143> | <144> | <151> | <152> | <153> | <154> |
|---|---|---|---|---|---|---|---|---|---|---|---|---|---|---|---|---|---|---|---|---|
| S1 CLK No. | 1 | 1 | 1 | 1 | 1 | 1 | 1 | 1 | 1 | 1 | 1 | 1 | 1 | 1 | 1 | 1 | 1 | 1 | 1 | 1 |
| S2 buffer No.: G() | 5 | 4 | 3 | 2 | 6 | 5 | 4 | 3 | 7 | 6 | 5 | 4 | 8 | 7 | 6 | 5 | 9 | 8 | 7 | 6 |
| S3 buffer No.: H() | 1 | 2 | 3 | 4 | 1 | 2 | 3 | 4 | 1 | 2 | 3 | 4 | 1 | 2 | 3 | 4 | 1 | 2 | 3 | 4 |
| S1 out dt (ps) | 0 | 0 | 0 | 0 | 0 | 0 | 0 | 0 | 0 | 0 | 0 | 0 | 0 | 0 | 0 | 0 | 0 | 0 | 0 | 0 |
| VSDL1 dt (ps) | 800 | 540 | 480 | 320 | 960 | 800 | 640 | 480 | 1120 | 960 | 800 | 640 | 1280 | 1120 | 960 | 800 | 1440 | 1280 | 1120 | 960 |
| VSDL2 dt (ps) | 200 | 400 | 600 | 800 | 200 | 400 | 600 | 800 | 200 | 400 | 600 | 800 | 200 | 400 | 600 | 800 | 200 | 400 | 600 | 800 |
| Delay Line Total Tpd (ps) | 1000 | 1040 | 1080 | 1120 | 1160 | 1200 | 1240 | 1280 | 1320 | 1360 | 1400 | 1440 | 1480 | 1520 | 1560 | 1600 | 1640 | 1680 | 1720 | 1780 |
| Delay Line dt (ps) | 0 | 40 | 40 | 40 | 40 | 40 | 40 | 40 | 40 | 40 | 40 | 40 | 40 | 40 | 40 | 40 | 40 | 40 | 40 | 40 |

| | <211> | <212> | <213> | <214> | <221> | <222> | <223> | <224> | <231> | <232> | <233> | <234> | <241> | <242> | <243> | <244> | <251> | <252> | <253> | <254> |
|---|---|---|---|---|---|---|---|---|---|---|---|---|---|---|---|---|---|---|---|---|
| S1 CLK No. | 1 | 1 | 1 | 1 | 1 | 1 | 1 | 1 | 1 | 1 | 1 | 1 | 1 | 1 | 1 | 1 | 1 | 1 | 1 | 1 |
| S2 buffer No.: G() | 5 | 4 | 3 | 2 | 6 | 5 | 4 | 3 | 7 | 6 | 5 | 4 | 8 | 7 | 6 | 5 | 9 | 8 | 7 | 6 |
| S3 buffer No.: H() | 5 | 6 | 7 | 8 | 5 | 6 | 7 | 8 | 5 | 6 | 7 | 8 | 5 | 6 | 7 | 8 | 5 | 6 | 7 | 8 |
| S1 out dt (ps) | 0 | 0 | 0 | 0 | 0 | 0 | 0 | 0 | 0 | 0 | 0 | 0 | 0 | 0 | 0 | 0 | 0 | 0 | 0 | 0 |
| VSDL1 dt (ps) | 800 | 840 | 480 | 320 | 980 | 800 | 640 | 480 | 1120 | 960 | 800 | 640 | 1280 | 1200 | 960 | 800 | 1440 | 1280 | 1120 | 1600 |
| VSDL2 dt (ps) | 1000 | 1200 | 1400 | 1600 | 1000 | 1200 | 1400 | 1600 | 1000 | 1200 | 1400 | 1600 | 1000 | 1200 | 1400 | 1600 | 1000 | 1200 | 1400 | 1600 |
| Delay Line Total Tpd (ps) | 1800 | 1840 | 1680 | 1920 | 1960 | 2000 | 2040 | 2080 | 2120 | 2160 | 2200 | 2240 | 2280 | 2320 | 2360 | 2400 | 2440 | 2480 | 2520 | 2560 |
| Delay Line dt (ps) | 40 | 40 | 40 | 40 | 40 | 40 | 40 | 40 | 40 | 40 | 40 | 40 | 40 | 40 | 40 | 40 | 40 | 40 | 40 | 40 |

| | <311> | <312> | <313> | <314> | <321> | <322> | <323> | <324> | <331> | <332> | <333> | <334> | <341> | <342> | <343> | <344> | <351> | <352> | <353> | <354> |
|---|---|---|---|---|---|---|---|---|---|---|---|---|---|---|---|---|---|---|---|---|
| S1 CLK No. | 3 | 3 | 3 | 3 | 3 | 3 | 3 | 3 | 3 | 3 | 3 | 3 | 3 | 3 | 3 | 3 | 3 | 3 | 3 | 3 |
| S2 buffer No.: G() | 5 | 4 | 3 | 2 | 6 | 5 | 4 | 3 | 7 | 6 | 5 | 4 | 8 | 7 | 6 | 5 | 9 | 8 | 7 | 6 |
| S3 buffer No.: H() | 1 | 2 | 3 | 4 | 1 | 2 | 3 | 4 | 1 | 2 | 3 | 4 | 1 | 2 | 3 | 4 | 1 | 2 | 3 | 4 |
| S1 out dt (ps) | 1600 | 1600 | 1600 | 1600 | 1600 | 1600 | 1600 | 1600 | 1600 | 1600 | 1600 | 1800 | 1600 | 1600 | 1600 | 1600 | 1600 | 1600 | 1600 | 1600 |
| VSDL1 dt (ps) | 800 | 640 | 480 | 320 | 960 | 800 | 640 | 480 | 1120 | 960 | 800 | 640 | 1280 | 1120 | 960 | 800 | 1440 | 1280 | 1120 | 960 |
| VSDL2 dt (ps) | 200 | 400 | 600 | 800 | 200 | 400 | 600 | 800 | 200 | 400 | 600 | 800 | 200 | 400 | 600 | 800 | 200 | 400 | 600 | 800 |
| Delay Line Total Tpd (ps) | 2600 | 2640 | 2680 | 2720 | 2760 | 2800 | 2840 | 2880 | 2920 | 2960 | 3000 | 3040 | 3080 | 3120 | 3160 | 3200 | 3240 | 3280 | 3320 | 3360 |
| Delay Line dt (ps) | 40 | 40 | 40 | 40 | 40 | 40 | 40 | 40 | 40 | 40 | 40 | 40 | 40 | 40 | 40 | 40 | 40 | 40 | 40 | 40 |

| | <411> | <412> | <413> | <414> | <421> | <422> | <423> | <424> | <431> | <432> | <433> | <434> | <441> | <442> | <443> | <444> | <451> | <452> | <453> | <454> |
|---|---|---|---|---|---|---|---|---|---|---|---|---|---|---|---|---|---|---|---|---|
| S1 CLK No. | 3 | 3 | 3 | 3 | 3 | 3 | 3 | 3 | 3 | 3 | 3 | 3 | 3 | 3 | 3 | 3 | 3 | 3 | 3 | 3 |
| S2 buffer No.: G() | 5 | 4 | 3 | 2 | 6 | 5 | 4 | 3 | 7 | 6 | 5 | 4 | 8 | 7 | 6 | 5 | 9 | 8 | 7 | 6 |
| S3 buffer No.: H() | 5 | 6 | 7 | 8 | 5 | 6 | 7 | 8 | 5 | 6 | 7 | 8 | 5 | 6 | 7 | 8 | 5 | 6 | 7 | 8 |
| S1 out dt (ps) | 1600 | 1600 | 1600 | 1600 | 1600 | 1600 | 1600 | 1600 | 1600 | 1600 | 1600 | 1600 | 1600 | 1600 | 1600 | 1600 | 1600 | 1600 | 1600 | 1600 |
| VSDL1 dt (ps) | 800 | 640 | 480 | 320 | 960 | 800 | 640 | 480 | 1120 | 960 | 800 | 640 | 1280 | 1120 | 960 | 800 | 1440 | 1280 | 1120 | 960 |
| VSDL2 dt (ps) | 1000 | 1200 | 1400 | 1600 | 1000 | 1200 | 1400 | 1600 | 1000 | 1200 | 1400 | 1600 | 1000 | 1200 | 1400 | 1600 | 1000 | 1200 | 1400 | 1600 |
| Delay Line Total Tpd (ps) | 3400 | 3440 | 3480 | 3520 | 3560 | 3600 | 3640 | 3680 | 3720 | 3760 | 3800 | 3840 | 3880 | 3920 | 3960 | 4000 | 4040 | 4080 | 4120 | 4160 |
| Delay Line dt (ps) | 40 | 40 | 40 | 40 | 40 | 40 | 40 | 40 | 40 | 40 | 40 | 40 | 40 | 40 | 40 | 40 | 40 | 40 | 40 | 40 |

TABLE 2

| | <111> | <112> | <113> | <114> | <121> | <122> | <123> | <124> | <131> | <132> | <133> | <134> | <141> | <142> | <143> | <144> | <151> | <152> | <153> | <154> |
|---|---|---|---|---|---|---|---|---|---|---|---|---|---|---|---|---|---|---|---|---|
| S1 CLK No. | 4 | 4 | 4 | 4 | 4 | 4 | 4 | 4 | 4 | 4 | 4 | 4 | 4 | 4 | 4 | 4 | 4 | 4 | 4 | 4 |
| S2 buffer No.: G() | 5 | 6 | 7 | 8 | 4 | 5 | 6 | 7 | 3 | 4 | 5 | 6 | 2 | 3 | 4 | 5 | 1 | 2 | 3 | 4 |
| S3 buffer No.: H() | 4 | 3 | 2 | 1 | 4 | 3 | 2 | 1 | 4 | 3 | 2 | 1 | 4 | 3 | 2 | 1 | 4 | 3 | 2 | 1 |
| S1 out dt (ps) | 2400 | 2400 | 2400 | 2400 | 2400 | 2400 | 2400 | 2400 | 2400 | 2400 | 2400 | 2400 | 2400 | 2400 | 2400 | 2400 | 2400 | 2400 | 2400 | 2400 |
| VSDL1 dt (ps) | 800 | 960 | 1120 | 1280 | 640 | 800 | 960 | 1120 | 480 | 640 | 800 | 960 | 320 | 480 | 640 | 800 | 160 | 320 | 480 | 840 |
| VSDL2 dt (ps) | 800 | 600 | 400 | 200 | 800 | 600 | 400 | 200 | 800 | 600 | 400 | 200 | 800 | 600 | 400 | 200 | 800 | 600 | 400 | 200 |
| Delay Line Total Tpd (ps) | 4000 | 3960 | 3920 | 3880 | 3840 | 3800 | 3760 | 3720 | 3680 | 3640 | 3600 | 3560 | 3520 | 3480 | 3440 | 3400 | 3360 | 3320 | 3280 | 3240 |
| Delay Line dt (ps) | 0 | −40 | −40 | −40 | −40 | −40 | −40 | −40 | −40 | −40 | −40 | −40 | −40 | −40 | −40 | −40 | −40 | −40 | −40 | −40 |

| | <211> | <212> | <213> | <214> | <221> | <222> | <223> | <224> | <231> | <232> | <233> | <234> | <241> | <242> | <243> | <244> | <251> | <252> | <253> | <254> |
|---|---|---|---|---|---|---|---|---|---|---|---|---|---|---|---|---|---|---|---|---|
| S1 CLK No. | 3 | 3 | 3 | 3 | 3 | 3 | 3 | 3 | 3 | 3 | 3 | 3 | 3 | 3 | 3 | 3 | 3 | 3 | 3 | 3 |
| S2 buffer No.: G() | 5 | 6 | 7 | 8 | 4 | 5 | 6 | 7 | 3 | 4 | 5 | 6 | 2 | 3 | 4 | 5 | 1 | 2 | 3 | 4 |
| S3 buffer No.: H() | 4 | 3 | 2 | 1 | 4 | 3 | 2 | 1 | 4 | 3 | 2 | 1 | 4 | 3 | 2 | 1 | 4 | 3 | 2 | 1 |
| S1 out dt (ps) | 1600 | 1600 | 1600 | 1600 | 1600 | 1600 | 1600 | 1600 | 1600 | 1600 | 1600 | 1600 | 1600 | 1600 | 1600 | 1600 | 1600 | 1600 | 1600 | 1600 |
| VSDL1 dt (ps) | 800 | 960 | 1120 | 1280 | 640 | 800 | 960 | 1120 | 480 | 640 | 800 | 960 | 320 | 480 | 640 | 800 | 160 | 320 | 480 | 640 |
| VSDL2 dt (ps) | 800 | 600 | 400 | 200 | 800 | 600 | 400 | 200 | 800 | 600 | 400 | 200 | 800 | 600 | 400 | 200 | 800 | 600 | 400 | 200 |
| Delay Line Total Tpd (ps) | 3200 | 3160 | 3120 | 3080 | 3040 | 3000 | 2960 | 2920 | 2880 | 2840 | 2800 | 2760 | 2720 | 2680 | 2640 | 2600 | 2560 | 2520 | 2480 | 2440 |
| Delay Line dt (ps) | −40 | −40 | −40 | −40 | −40 | −40 | −40 | −40 | −40 | −40 | −40 | −40 | −40 | −40 | −40 | −40 | −40 | −40 | −40 | −40 |

| | <311> | <312> | <313> | <314> | <321> | <322> | <323> | <324> | <331> | <332> | <333> | <334> | <341> | <342> | <343> | <344> | <351> | <352> | <353> | <354> |
|---|---|---|---|---|---|---|---|---|---|---|---|---|---|---|---|---|---|---|---|---|
| S1 CLK No. | 2 | 2 | 2 | 2 | 2 | 2 | 2 | 2 | 2 | 2 | 2 | 2 | 2 | 2 | 2 | 2 | 2 | 2 | 2 | 2 |
| S2 buffer No.: G() | 5 | 6 | 7 | 8 | 4 | 5 | 6 | 7 | 3 | 4 | 5 | 6 | 2 | 3 | 4 | 5 | 1 | 2 | 3 | 4 |
| S3 buffer No.: H() | 4 | 3 | 2 | 1 | 4 | 3 | 2 | 1 | 4 | 3 | 2 | 1 | 4 | 3 | 2 | 1 | 4 | 3 | 2 | 1 |
| S1 out dt (ps) | 800 | 800 | 800 | 800 | 800 | 800 | 800 | 800 | 800 | 800 | 800 | 800 | 800 | 800 | 800 | 800 | 800 | 800 | 800 | 800 |
| VSDL1 dt (ps) | 800 | 960 | 1120 | 1280 | 640 | 800 | 960 | 1120 | 480 | 640 | 800 | 960 | 320 | 480 | 640 | 800 | 160 | 320 | 480 | 640 |
| VSDL2 dt (ps) | 800 | 600 | 400 | 200 | 800 | 600 | 400 | 200 | 800 | 600 | 400 | 200 | 800 | 600 | 400 | 200 | 800 | 600 | 400 | 200 |
| Delay Line Total Tpd (ps) | 2400 | 2360 | 2320 | 2280 | 2240 | 2200 | 2160 | 2120 | 2080 | 2040 | 2000 | 1960 | 1920 | 1880 | 1840 | 1800 | 1760 | 1720 | 1680 | 1640 |
| Delay Line dt (ps) | −40 | −40 | −40 | −40 | −40 | −40 | −40 | −40 | −40 | −40 | −40 | −40 | −40 | −40 | −40 | −40 | −40 | −40 | −40 | −40 |

| | <411> | <412> | <413> | <414> | <421> | <422> | <423> | <424> | <431> | <432> | <433> | <434> | <441> | <442> | <443> | <444> | <451> | <452> | <453> | <454> |
|---|---|---|---|---|---|---|---|---|---|---|---|---|---|---|---|---|---|---|---|---|
| S1 CLK No. | 1 | 1 | 1 | 1 | 1 | 1 | 1 | 1 | 1 | 1 | 1 | 1 | 1 | 1 | 1 | 1 | 1 | 1 | 1 | 1 |
| S2 buffer No.: G() | 5 | 6 | 7 | 8 | 4 | 5 | 6 | 7 | 3 | 4 | 5 | 6 | 2 | 3 | 4 | 5 | 1 | 2 | 3 | 4 |
| S3 buffer No.: H() | 4 | 3 | 2 | 1 | 4 | 3 | 2 | 1 | 4 | 3 | 2 | 1 | 4 | 3 | 2 | 1 | 4 | 3 | 2 | 1 |
| S1 out dt (ps) | 0 | 0 | 0 | 0 | 0 | 0 | 0 | 0 | 0 | 0 | 0 | 0 | 0 | 0 | 0 | 0 | 0 | 0 | 0 | 0 |
| VSDL1 dt (ps) | 800 | 960 | 1120 | 1280 | 640 | 800 | 960 | 1120 | 480 | 640 | 800 | 960 | 320 | 480 | 640 | 800 | 160 | 320 | 480 | 640 |
| VSDL2 dt (ps) | 800 | 600 | 400 | 200 | 800 | 600 | 400 | 200 | 800 | 600 | 400 | 200 | 800 | 600 | 400 | 200 | 800 | 600 | 400 | 200 |
| Delay Line Total Tpd (ps) | 1600 | 1560 | 1520 | 1480 | 1440 | 1400 | 1360 | 1320 | 1280 | 1240 | 1200 | 1160 | 1120 | 1080 | 1040 | 1000 | 960 | 920 | 880 | 840 |
| Delay Line dt (ps) | −40 | −40 | −40 | −40 | −40 | −40 | −40 | −40 | −40 | −40 | −40 | −40 | −40 | −40 | −40 | −40 | −40 | −40 | −40 | −40 |

TABLE 3

| | \multicolumn{6}{c}{row: 200 ps Buffer} | | | | | |
|---|---|---|---|---|---|---|
| | 0 | 1 | 2 | 3 | 4 | 5 |
| A | 0 | 200 | 400 | 600 | 800 | 1000 |
| B | 160 | 360 | 560 | 760 | 960 | 1160 |
| C | 320 | 520 | 720 | 920 | 1120 | 1320 |
| D | 480 | 680 | 880 | 1080 | 1280 | 1480 |

TABLE 3-continued

| | \multicolumn{6}{c}{row: 200 ps Buffer} | | | | | |
|---|---|---|---|---|---|---|
| | 0 | 1 | 2 | 3 | 4 | 5 |
| E | 640 | 840 | 1040 | 1240 | 1440 | 1640 |
| F | 800 | 1000 | 1200 | 1400 | 1600 | 1800 | column: 160 ps Buffer

TABLE 4

| | <111> | <112> | <113> | <114> | <121> | <122> | <123> | <124> | <131> | <132> | <133> | <134> | <141> | <142> | <143> | <144> | <151> | <152> | <153> | <154> |
|---|---|---|---|---|---|---|---|---|---|---|---|---|---|---|---|---|---|---|---|---|
| S1 CLK No. | 1 | 1 | 1 | 1 | 1 | 1 | 1 | 1 | 1 | 1 | 1 | 1 | 1 | 1 | 1 | 1 | 1 | 1 | 1 | 1 |
| S4 output No. | d0 | c1 | b2 | a3 | e0 | d1 | c2 | b3 | a4 | e1 | d2 | c3 | b4 | f1 | e2 | d3 | c4 | b5 | f2 | e3 |
| S1 out dt (ps) | 0 | 0 | 0 | 0 | 0 | 0 | 0 | 0 | 0 | 0 | 0 | 0 | 0 | 0 | 0 | 0 | 0 | 0 | 0 | 0 |
| DLL3,4 dt (ps) | 480 | 520 | 560 | 600 | 640 | 680 | 720 | 760 | 800 | 840 | 880 | 920 | 960 | 1000 | 1040 | 1080 | 1120 | 1160 | 1200 | 1240 |
| Delay Line Total Tpd (ps) | 480 | 520 | 560 | 600 | 640 | 680 | 720 | 760 | 800 | 840 | 880 | 920 | 960 | 1000 | 1040 | 1080 | 1120 | 1160 | 1200 | 1240 |
| Delay Line dt (ps) | 0 | 40 | 40 | 40 | 40 | 40 | 40 | 40 | 40 | 40 | 40 | 40 | 40 | 40 | 40 | 40 | 40 | 40 | 40 | 40 |

| | <211> | <212> | <213> | <214> | <221> | <222> | <223> | <224> | <231> | <232> | <233> | <234> | <241> | <242> | <243> | <244> | <251> | <252> | <253> | <254> |
|---|---|---|---|---|---|---|---|---|---|---|---|---|---|---|---|---|---|---|---|---|
| S1 CLK No. | 2 | 2 | 2 | 2 | 2 | 2 | 2 | 2 | 2 | 2 | 2 | 2 | 2 | 2 | 2 | 2 | 2 | 2 | 2 | 2 |
| S4 output No. | d0 | c1 | b2 | a3 | e0 | d1 | c2 | b3 | a4 | e1 | d2 | c3 | b4 | f1 | e2 | d3 | c4 | b5 | f2 | e3 |
| S1 out dt (ps) | 800 | 800 | 800 | 800 | 800 | 800 | 800 | 800 | 800 | 800 | 800 | 800 | 800 | 800 | 800 | 800 | 800 | 800 | 800 | 800 |
| DLL3,4 dt (ps) | 480 | 520 | 560 | 600 | 640 | 680 | 720 | 760 | 800 | 840 | 880 | 920 | 960 | 1000 | 1040 | 1080 | 1120 | 1160 | 1200 | 1240 |
| Delay Line Total Tpd (ps) | 1280 | 1320 | 1360 | 1400 | 1440 | 1480 | 1520 | 1560 | 1600 | 1640 | 1680 | 1720 | 1760 | 1800 | 1840 | 1880 | 1920 | 1960 | 2000 | 2040 |
| Delay Line dt (ps) | 40 | 40 | 40 | 40 | 40 | 40 | 40 | 40 | 40 | 40 | 40 | 40 | 40 | 40 | 40 | 40 | 40 | 40 | 40 | 40 |

| | <311> | <312> | <313> | <314> | <321> | <322> | <323> | <324> | <331> | <332> | <333> | <334> | <341> | <342> | <343> | <344> | <351> | <352> | <353> | <354> |
|---|---|---|---|---|---|---|---|---|---|---|---|---|---|---|---|---|---|---|---|---|
| S1 CLK No. | 3 | 3 | 3 | 3 | 3 | 3 | 3 | 3 | 3 | 3 | 3 | 3 | 3 | 3 | 3 | 3 | 3 | 3 | 3 | 3 |
| S4 output No. | d0 | c1 | b2 | a3 | e0 | d1 | c2 | b3 | a4 | e1 | d2 | c3 | b4 | f1 | e2 | d3 | c4 | b5 | f2 | e3 |
| S1 out dt (ps) | 1600 | 1600 | 1600 | 1600 | 1600 | 1600 | 1600 | 1600 | 1600 | 1600 | 1600 | 1600 | 1600 | 1600 | 1600 | 1600 | 1600 | 1600 | 1600 | 1600 |
| DLL3,4 dt (ps) | 480 | 520 | 560 | 600 | 640 | 680 | 720 | 760 | 800 | 840 | 880 | 920 | 960 | 1000 | 1040 | 1080 | 1120 | 1160 | 1200 | 1240 |
| Delay Line Total Tpd (ps) | 2080 | 2120 | 2160 | 2200 | 2240 | 2280 | 2320 | 2360 | 2400 | 2440 | 2480 | 2520 | 2560 | 2600 | 2640 | 2680 | 2720 | 2760 | 2800 | 2840 |
| Delay Line dt (ps) | 40 | 40 | 40 | 40 | 40 | 40 | 40 | 40 | 40 | 40 | 40 | 40 | 40 | 40 | 40 | 40 | 40 | 40 | 40 | 40 |

| | <411> | <412> | <413> | <414> | <421> | <422> | <423> | <424> | <431> | <432> | <433> | <434> | <441> | <442> | <443> | <444> | <451> | <452> | <453> | <454> |
|---|---|---|---|---|---|---|---|---|---|---|---|---|---|---|---|---|---|---|---|---|
| S1 CLK No. | 4 | 4 | 4 | 4 | 4 | 4 | 4 | 4 | 4 | 4 | 4 | 4 | 4 | 4 | 4 | 4 | 4 | 4 | 4 | 4 |
| S4 output No. | d0 | c1 | b2 | a3 | e0 | d1 | c2 | b3 | a4 | e1 | d2 | c3 | b1 | f1 | e2 | d3 | c4 | b5 | f2 | e3 |
| S1 out dt (ps) | 2400 | 2400 | 2400 | 2400 | 2400 | 2400 | 2400 | 2400 | 2400 | 2400 | 2400 | 2400 | 2400 | 2400 | 2400 | 2400 | 2400 | 2400 | 2400 | 2400 |
| DLL3,4 dt (ps) | 480 | 520 | 560 | 600 | 640 | 680 | 720 | 760 | 800 | 840 | 880 | 920 | 960 | 1000 | 1040 | 1080 | 1120 | 1160 | 1200 | 1240 |
| Delay Line Total Tpd (ps) | 2880 | 2920 | 2960 | 3000 | 3040 | 3080 | 3120 | 3160 | 3200 | 3240 | 3280 | 3320 | 3360 | 3400 | 3440 | 3480 | 3520 | 3560 | 3600 | 3640 |
| Delay Line dt (ps) | 40 | 40 | 40 | 40 | 40 | 40 | 40 | 40 | 40 | 40 | 40 | 40 | 40 | 40 | 40 | 40 | 40 | 40 | 40 | 40 |

TABLE 5

| | <111> | <112> | <113> | <114> | <121> | <122> | <123> | <124> | <131> | <132> | <133> | <134> | <141> | <142> | <143> | <144> | <151> | <152> | <153> | <154> |
|---|---|---|---|---|---|---|---|---|---|---|---|---|---|---|---|---|---|---|---|---|
| S1 CLK No | 1 | 1 | 1 | 1 | 1 | 1 | 1 | 1 | 1 | 1 | 1 | 1 | 1 | 1 | 1 | 1 | 1 | 1 | 1 | 1 |
| S5 out-put No.: a(), a()B | 1 | 1 | 1 | 1 | 2 | 2 | 2 | 2 | 3 | 3 | 3 | 3 | 4 | 4 | 4 | 4 | 5 | 5 | 5 | 5 |
| cyclic31 off: sw() | 0 | 2 | 3 | 4 | 1 | 2 | 3 | 4 | 1 | 2 | 3 | 4 | 1 | 2 | 3 | 4 | 1 | 2 | 3 | 4 |
| S1 out dt (ps) | 160 | 160 | 160 | 160 | 320 | 320 | 320 | 320 | 480 | 480 | 480 | 480 | 640 | 640 | 640 | 640 | 800 | 800 | 800 | 800 |
| DLL6 dt (ps) | 680 | 720 | 760 | 800 | 680 | 720 | 760 | 800 | 680 | 720 | 760 | 800 | 680 | 720 | 760 | 800 | 680 | 720 | 760 | 800 |
| cyclic31 dt (ps) | 2440 | 2480 | 2520 | 2560 | 2600 | 2640 | 2680 | 2720 | 2760 | 2800 | 2840 | 2880 | 2920 | 2960 | 3000 | 3040 | 3080 | 3120 | 3160 | 3200 |
| Delay Line Total Tpd (ps) | | | | | | | | | | | | | | | | | | | | |
| Delay Line dt (ps) | 40 | 40 | 40 | 40 | 40 | 40 | 40 | 40 | 40 | 40 | 40 | 40 | 40 | 40 | 40 | 40 | 40 | 40 | 40 | 40 |

| | <211> | <212> | <213> | <214> | <221> | <222> | <223> | <224> | <231> | <232> | <233> | <234> | <241> | <242> | <243> | <244> | <251> | <252> | <253> | <254> |
|---|---|---|---|---|---|---|---|---|---|---|---|---|---|---|---|---|---|---|---|---|
| S1 CLK No | 2 | 2 | 2 | 2 | 2 | 2 | 2 | 2 | 2 | 2 | 2 | 2 | 2 | 2 | 2 | 2 | 2 | 2 | 2 | 2 |
| S5 out-put No.: a(), a()B | 1 | 1 | 1 | 1 | 2 | 2 | 2 | 2 | 3 | 3 | 3 | 3 | 4 | 4 | 4 | 4 | 5 | 5 | 5 | 5 |
| cyclic31 off: sw() | 1 | 2 | 3 | 4 | 1 | 2 | 3 | 4 | 1 | 2 | 3 | 4 | 1 | 2 | 3 | 4 | 1 | 2 | 3 | 4 |
| S1 out dt (ps) | 800 | 800 | 800 | 800 | 800 | 800 | 800 | 800 | 800 | 800 | 800 | 800 | 800 | 800 | 800 | 800 | 800 | 800 | 800 | 800 |
| DLL6 dt (ps) | 160 | 160 | 160 | 160 | 320 | 320 | 320 | 320 | 480 | 480 | 480 | 480 | 640 | 640 | 640 | 640 | 800 | 800 | 800 | 800 |
| cyclic31 dt (ps) | 680 | 720 | 760 | 800 | 680 | 720 | 760 | 800 | 680 | 720 | 760 | 800 | 680 | 720 | 760 | 800 | 680 | 720 | 760 | 800 |
| Delay Line Total Tpd (ps) | 3240 | 3280 | 3320 | 3360 | 3400 | 3440 | 3480 | 3520 | 3560 | 3600 | 3640 | 3680 | 3720 | 3760 | 3800 | 3840 | 3880 | 3920 | 3960 | 4000 |
| Delay Line dt (ps) | 40 | 40 | 40 | 40 | 40 | 40 | 40 | 40 | 40 | 40 | 40 | 40 | 40 | 40 | 40 | 40 | 40 | 40 | 40 | 40 |

| | <311> | <312> | <313> | <314> | <321> | <322> | <323> | <324> | <331> | <332> | <333> | <334> | <341> | <342> | <343> | <344> | <351> | <352> | <353> | <354> |
|---|---|---|---|---|---|---|---|---|---|---|---|---|---|---|---|---|---|---|---|---|
| S1 CLK No | 3 | 3 | 3 | 3 | 3 | 3 | 3 | 3 | 3 | 3 | 3 | 3 | 3 | 3 | 3 | 3 | 3 | 3 | 3 | 3 |
| S5 out-put No.: a(), a()B | 1 | 1 | 1 | 1 | 2 | 2 | 2 | 2 | 3 | 3 | 3 | 3 | 4 | 4 | 4 | 4 | 5 | 5 | 5 | 5 |
| cyclic31 off: sw() | 1 | 2 | 3 | 4 | 1 | 2 | 3 | 4 | 1 | 2 | 3 | 4 | 1 | 2 | 3 | 4 | 1 | 2 | 3 | 4 |
| S1 out dt (ps) | 1600 | 1600 | 1600 | 1600 | 1600 | 1600 | 1600 | 1600 | 1600 | 1600 | 1600 | 1600 | 1800 | 1600 | 1600 | 1600 | 1600 | 1600 | 1600 | 1600 |
| DLL6 dt (ps) | 160 | 160 | 160 | 160 | 320 | 320 | 320 | 320 | 480 | 480 | 480 | 480 | 480 | 640 | 640 | 640 | 800 | 800 | 800 | 800 |
| cyclic31 dt (ps) | 680 | 720 | 760 | 800 | 680 | 720 | 760 | 800 | 680 | 720 | 760 | 800 | 800 | 720 | 760 | 800 | 680 | 720 | 760 | 800 |
| Delay Line Total Tpd (ps) | 4040 | 4080 | 4120 | 4160 | 4200 | 4240 | 4280 | 4320 | 4360 | 4400 | 4440 | 4480 | 4520 | 4560 | 4600 | 4640 | 4680 | 4720 | 4760 | 4800 |
| Delay Line dt (ps) | 40 | 40 | 40 | 40 | 40 | 40 | 40 | 40 | 40 | 40 | 40 | 40 | 40 | 40 | 40 | 40 | 40 | 40 | 40 | 40 |

| | <411> | <412> | <413> | <414> | <421> | <422> | <423> | <424> | <431> | <432> | <433> | <434> | <441> | <442> | <443> | <444> | <451> | <452> | <453> | <454> |
|---|---|---|---|---|---|---|---|---|---|---|---|---|---|---|---|---|---|---|---|---|
| S1 CLK No | 4 | 4 | 4 | 4 | 4 | 4 | 4 | 4 | 4 | 4 | 4 | 4 | 4 | 4 | 4 | 4 | 4 | 4 | 4 | 4 |
| S5 out-put No.: a(), a()B | 1 | 1 | 1 | 1 | 2 | 2 | 2 | 2 | 3 | 3 | 3 | 3 | 4 | 4 | 4 | 4 | 5 | 5 | 5 | 5 |
| cyclic31 off: sw() | 1 | 2 | 3 | 4 | 1 | 2 | 3 | 4 | 1 | 2 | 3 | 4 | 1 | 2 | 3 | 4 | 1 | 2 | 3 | 4 |
| S1 out dt (ps) | 2400 | 2400 | 2400 | 2400 | 2400 | 2400 | 2400 | 2400 | 2400 | 2400 | 2400 | 2400 | 2400 | 2400 | 2400 | 2400 | 2400 | 2400 | 2400 | 2400 |
| DLL6 dt (ps) | 160 | 160 | 160 | 160 | 320 | 320 | 320 | 320 | 480 | 480 | 480 | 480 | 640 | 640 | 640 | 640 | 800 | 800 | 800 | 800 |
| cyclic31 dt (ps) | 680 | 720 | 760 | 800 | 680 | 720 | 760 | 800 | 680 | 720 | 760 | 800 | 680 | 720 | 760 | 800 | 680 | 720 | 760 | 800 |
| Delay Line Total Tpd (ps) | 4840 | 4880 | 4920 | 4960 | 5000 | 5040 | 5080 | 5120 | 5160 | 5200 | 5240 | 5280 | 5320 | 5360 | 5400 | 5440 | 5480 | 5520 | 5560 | 5600 |
| Delay Line dt (ps) | 40 | 40 | 40 | 40 | 40 | 40 | 40 | 40 | 40 | 40 | 40 | 40 | 40 | 40 | 40 | 40 | 40 | 40 | 40 | 40 |

TABLE 6

| | <111> | <112> | <113> | <114> | <121> | <122> | <123> | <124> | <131> | <132> | <133> | <134> | <141> | <142> | <143> | <144> | <151> | <152> | <153> | <154> |
|---|---|---|---|---|---|---|---|---|---|---|---|---|---|---|---|---|---|---|---|---|
| S1 CLK No | 4 | 4 | 4 | 4 | 4 | 4 | 4 | 4 | 4 | 4 | 4 | 4 | 4 | 4 | 4 | 4 | 4 | 4 | 4 | 4 |
| S5 out-put No.: a(), a()B | 5 | 5 | 5 | 5 | 4 | 4 | 4 | 4 | 3 | 3 | 3 | 3 | 2 | 2 | 2 | 2 | 1 | 1 | 1 | 1 |
| cyclic31 off: sw() | 4 | 3 | 2 | 1 | 4 | 3 | 2 | 1 | 4 | 3 | 2 | 1 | 4 | 3 | 2 | 1 | 4 | 3 | 2 | 1 |
| S1 out dt (ps) | 2400 | 2400 | 2400 | 2400 | 2400 | 2400 | 2400 | 2400 | 2400 | 2400 | 2400 | 2400 | 2400 | 2400 | 2400 | 2400 | 2400 | 2400 | 2400 | 2400 |
| DLL6 dt (ps) | 800 | 800 | 800 | 800 | 640 | 640 | 640 | 640 | 480 | 480 | 480 | 480 | 320 | 320 | 320 | 320 | 160 | 160 | 160 | 160 |
| cyclic31 dt (ps) | 800 | 760 | 720 | 680 | 800 | 760 | 720 | 680 | 800 | 760 | 720 | 680 | 800 | 760 | 720 | 680 | 800 | 760 | 720 | 680 |
| Delay Line Total Tpd (ps) | 5600 | 5560 | 5520 | 5480 | 5440 | 5400 | 5360 | 5320 | 5280 | 5240 | 5200 | 5160 | 5120 | 5080 | 5040 | 5000 | 4960 | 4920 | 4880 | 4840 |
| Delay Line dt (ps) | 0 | −40 | −40 | −40 | −40 | −40 | −40 | −40 | −40 | −40 | −40 | −40 | −40 | −40 | −40 | −40 | −40 | −40 | −40 | −40 |

| | <211> | <212> | <213> | <214> | <221> | <222> | <223> | <224> | <231> | <232> | <233> | <234> | <241> | <242> | <243> | <244> | <251> | <252> | <253> | <254> |
|---|---|---|---|---|---|---|---|---|---|---|---|---|---|---|---|---|---|---|---|---|
| S1 CLK No | 3 | 3 | 3 | 3 | 3 | 3 | 3 | 3 | 3 | 3 | 3 | 3 | 3 | 3 | 3 | 3 | 3 | 3 | 3 | 3 |
| S5 out-put No.: a(), a()B | 5 | 5 | 5 | 5 | 4 | 4 | 4 | 4 | 3 | 3 | 3 | 3 | 2 | 2 | 2 | 2 | 1 | 1 | 1 | 1 |
| cyclic31 off: sw() | 4 | 3 | 2 | 1 | 4 | 3 | 2 | 1 | 4 | 3 | 2 | 1 | 4 | 3 | 2 | 1 | 4 | 3 | 2 | 1 |
| S1 out dt (ps) | 1600 | 1600 | 1600 | 1600 | 1600 | 1600 | 1600 | 1600 | 1600 | 1600 | 1600 | 1600 | 1600 | 1600 | 1600 | 1600 | 1600 | 1600 | 1600 | 1600 |
| DLL6 dt (ps) | 800 | 800 | 800 | 800 | 640 | 640 | 640 | 640 | 480 | 480 | 480 | 480 | 320 | 320 | 320 | 320 | 160 | 160 | 160 | 160 |
| cyclic31 dt (ps) | 800 | 760 | 720 | 680 | 800 | 760 | 720 | 680 | 800 | 760 | 720 | 680 | 800 | 760 | 720 | 680 | 800 | 760 | 720 | 680 |
| Delay Line Total Tpd (ps) | 4800 | 4760 | 4720 | 4680 | 4640 | 4600 | 4560 | 4520 | 4480 | 4440 | 4400 | 4360 | 4320 | 4280 | 4240 | 4200 | 4160 | 4120 | 4080 | 4040 |
| Delay Line dt (ps) | −40 | −40 | −40 | −40 | −40 | −40 | −40 | −40 | −40 | −40 | −40 | −40 | −40 | −40 | −40 | −40 | −40 | −40 | −40 | −40 |

| | <311> | <312> | <313> | <314> | <321> | <322> | <323> | <324> | <331> | <332> | <333> | <334> | <341> | <342> | <343> | <344> | <351> | <352> | <353> | <354> |
|---|---|---|---|---|---|---|---|---|---|---|---|---|---|---|---|---|---|---|---|---|
| S1 CLK No | 2 | 2 | 2 | 2 | 2 | 2 | 2 | 2 | 2 | 2 | 2 | 2 | 2 | 2 | 2 | 2 | 2 | 2 | 2 | 2 |
| S5 out-put No.: a(), a()B | 5 | 5 | 5 | 5 | 4 | 4 | 4 | 4 | 3 | 3 | 3 | 3 | 2 | 2 | 2 | 2 | 1 | 1 | 1 | 1 |
| cyclic31 off: sw() | 4 | 3 | 2 | 1 | 4 | 3 | 2 | 1 | 4 | 3 | 2 | 1 | 4 | 3 | 2 | 1 | 4 | 3 | 2 | 1 |
| S1 out dt (ps) | 800 | 800 | 800 | 800 | 800 | 800 | 800 | 800 | 800 | 800 | 800 | 800 | 800 | 800 | 800 | 800 | 800 | 800 | 800 | 800 |
| DLL6 dt (ps) | 800 | 800 | 800 | 800 | 640 | 640 | 640 | 640 | 480 | 480 | 480 | 480 | 320 | 320 | 320 | 320 | 160 | 160 | 160 | 160 |
| cyclic31 dt (ps) | 800 | 760 | 720 | 680 | 800 | 760 | 720 | 680 | 800 | 760 | 720 | 680 | 800 | 760 | 720 | 680 | 800 | 760 | 720 | 680 |
| Delay Line Total Tpd (ps) | 4000 | 3960 | 3920 | 3880 | 3840 | 3800 | 3760 | 3720 | 3680 | 3640 | 3600 | 3560 | 3520 | 3480 | 3440 | 3400 | 3360 | 3320 | 3280 | 3240 |
| Delay Line dt (ps) | −40 | −40 | −40 | −40 | −40 | −40 | −40 | −40 | −40 | −40 | −40 | −40 | −40 | −40 | −40 | −40 | −40 | −40 | −40 | −40 |

| | <411> | <412> | <413> | <414> | <421> | <422> | <423> | <424> | <431> | <432> | <433> | <434> | <441> | <442> | <443> | <444> | <451> | <452> | <453> | <454> |
|---|---|---|---|---|---|---|---|---|---|---|---|---|---|---|---|---|---|---|---|---|
| S1 CLK No | 1 | 1 | 1 | 1 | 1 | 1 | 1 | 1 | 1 | 1 | 1 | 1 | 1 | 1 | 1 | 1 | 1 | 1 | 1 | 1 |
| S5 out-put No.: a(), a()B | 5 | 5 | 5 | 5 | 4 | 4 | 4 | 4 | 3 | 3 | 3 | 3 | 2 | 2 | 2 | 2 | 1 | 1 | 1 | 1 |
| cyclic31 off: sw() | 4 | 3 | 2 | 1 | 4 | 3 | 2 | 1 | 4 | 3 | 2 | 1 | 4 | 3 | 2 | 1 | 4 | 3 | 2 | 1 |
| S1 out dt (ps) | 0 | 0 | 0 | 0 | 0 | 0 | 0 | 0 | 0 | 0 | 0 | 0 | 0 | 0 | 0 | 0 | 0 | 0 | 0 | 0 |
| DLL6 dt (ps) | 800 | 800 | 800 | 800 | 640 | 640 | 640 | 640 | 480 | 480 | 480 | 480 | 320 | 320 | 320 | 320 | 160 | 160 | 160 | 160 |
| cyclic31 dt (ps) | 800 | 760 | 720 | 680 | 800 | 760 | 720 | 680 | 800 | 760 | 720 | 680 | 800 | 760 | 720 | 680 | 800 | 760 | 720 | 680 |
| Delay Line Total Tpd (ps) | 3200 | 3160 | 3120 | 3080 | 3040 | 3000 | 2960 | 2920 | 2880 | 2840 | 2800 | 2760 | 2720 | 2680 | 2640 | 2600 | 2560 | 2520 | 2480 | 2440 |
| Delay Line dt (ps) | −40 | −40 | −40 | −40 | −80 | 0 | −40 | −40 | −40 | −40 | −40 | −40 | −40 | −40 | −40 | −40 | −40 | −40 | −40 | −40 |

What is claimed is:

1. A digital phase control circuit that outputs one or more clock signals in which phase is controlled at a prescribed resolution with respect to received reference clock signals, comprising:

a first delay locked loop that is feedback-controlled and that contains a first voltage-controlled delay line comprising delay buffers having a first type of propagation delay time concatenated in h stages and that receives a selected one of said reference clock signals;

a second delay locked loop that is feedback-controlled and that contains i second voltage-controlled delay lines that are each connected to one of a respective output of i stages of outputs of said first voltage-controlled delay line and said selected at least one of said reference clock signals, each said second voltage-controlled delay line comprising delay buffers having a second type of propagation delay time concatenated in j stages;

a third delay locked loop that is feedback-controlled and that contains a third voltage-controlled delay line that is composed of delay buffers having said second type of propagation delay time concatenated in k stages; and a selector that switches a clock signal from one of selected ones of stages of said first voltage-controlled delay line and said second voltage-controlled delay line to be an input into said third voltage-controlled delay line wherein, a delay control voltage or current for maintaining resolution that is generated by said third delay locked loop that feedback-controls said third voltage-controlled delay line is supplied to each of the delay buffers of each of said second voltage-controlled delay lines.

2. A digital phase control circuit according to claim 1, wherein at least one voltage-controlled delay line of said second voltage-controlled delay lines is feedback-controlled by said second delay locked loop, and a delay control voltage or current for maintaining resolution that is generated by said second delay locked loop that feedback-controls said one voltage-controlled delay line is supplied to each delay buffer of the other second voltage-controlled delay lines to control the phase of clock signals.

3. A digital phase control circuit according to claim 1, wherein said resolution is set to 1/n (where n is an integer) of the period of said reference clock signals.

4. A digital phase control circuit that outputs one or more clock signals in which phase is controlled at a prescribed resolution with respect to received reference clock signals, comprising:

a first delay locked loop that is feedback-controlled and that contains a first voltage-controlled delay line comprising delay buffers having a first type of propagation delay time concatenated in a plurality of stages and that receives at least one of said reference clock signals and a current control circuit for adjusting current of a delay control signal;

a second delay locked loop that is feedback-controlled and that contains a second voltage-controlled delay line comprising delay buffers having a second type of propagation delay time concatenated in a plurality of stages and a current control circuit for adjusting current of a delay control signal;

a cyclic delay circuit that is connected to the input side of said second voltage-controlled delay line comprising variable delay buffers concatenated in a plurality of stages, a switch circuit for switching between said first type of propagation delay time and said second type of propagation delay time, and a current control circuit for adjusting current of a delay control signal; and a selector that receives as inputs a clock signal from each stage of said first voltage-controlled delay line and outputs a selected one of said clock signals to be an input into said cyclic delay circuit.

5. A digital phase control circuit according to claim 4, wherein said resolution is set to 1/n (where n is an integer) of the period of said reference clock signals.

* * * * *